(12) United States Patent
Iwamatsu

(10) Patent No.: US 6,175,591 B1
(45) Date of Patent: Jan. 16, 2001

(54) RADIO RECEIVING APPARATUS

(75) Inventor: Takanori Iwamatsu, Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/022,955

(22) Filed: Feb. 12, 1998

(30) Foreign Application Priority Data

Aug. 29, 1997 (JP) .................................. 9-233748

(51) Int. Cl.$^7$ .................................................. H03H 7/30
(52) U.S. Cl. .......................... 375/232; 375/235; 375/326; 375/350; 375/355
(58) Field of Search .............................. 375/232, 233, 375/235, 324, 322, 326, 350, 355, 360

(56) References Cited

U.S. PATENT DOCUMENTS

| 5,001,727 | * | 3/1991 | McDavid | 375/326 |
| 5,067,137 | * | 11/1991 | Kaneko | 375/232 |
| 5,675,612 | * | 10/1997 | Solve et al. | 375/326 |

FOREIGN PATENT DOCUMENTS 8256188   10/1996  (JP).

* cited by examiner

Primary Examiner—Don N. Vo
(74) Attorney, Agent, or Firm—Helfgott & Karas, P.C.

(57) ABSTRACT

A radio receiving apparatus regenerates a clock synchronized to a symbol clock contained in a quadrature demodulated signal obtained by demodulating a multilevel quadrature modulated signal, converts the analog quadrature demodulated signal, at the timing at which the regenerated clock occurs, to digital data and outputs the digital data via a transversal equalizer. The apparatus includes a slope discriminator for outputting the slope of an in-phase signal constituting the quadrature demodulated signal. A FIR filter constructing the equalizer outputs, as an error signal between input and output signals of the equalizer, an output signal of the FIR filter which prevails when a center tap coefficient of the filter is regarded as being zero. A clock phase detector outputs a phase signal, which conforms to a phase difference between the regenerated clock and the symbol clock, using the slope and the error signal, and a clock regenerating circuit generates a clock based upon the phase signal in such a manner that the phase difference is eliminated.

13 Claims, 24 Drawing Sheets

| SLOPE | E | SLOPE SHIFT DIRECTION |
|---|---|---|
| POSITIVE(0) | 1 | DELAY (1) |
| POSITIVE(0) | 0 | ADVANCE (0) |

| SLOPE | E | SLOPE SHIFT DIRECTION |
|---|---|---|
| NEGATIVE(1) | 1 | ADVANCE (0) |
| NEGATIVE(1) | 0 | DELAY (1) |

RADIO RECEIVING APPARATUS

BACKGROUND OF THE INVENTION

This invention relates to a radio receiving apparatus and, more particularly, to a radio receiving apparatus having a clock regenerating circuit for regenerating a clock, which is synchronized to a symbol clock on the transmitting side, and identifying a demodulated signal by the timing of the regenerated clock.

A clock regenerating circuit used in the receiver section of a multiplexed radio apparatus is referred to also as a BTR (Bit Timing Recovery) circuit and is used to regenerate a clock component from a signal obtained by demodulating a multilevel quadrature modulated signal such as a signal modulated by PSK (Phase Shift Keying) or QAM (Quadrature Amplitude Modulation). The clock regenerated by the clock regenerating circuit is used as the operation timing signal of a device such as an AD converter for identifying a demodulated signal. To this end, it is required that the phase of the regenerated clock be made to coincide with the timing at which the level of the demodulated signal is identified (which timing is the moment at which the so-called eye pattern is open to the maximum extent). However, owing to changes in line conditions such as caused by a change in temperature, there are instances where the clock develops a phase shift. Accordingly, there is demand for a clock regenerating circuit that is capable of regenerating a highly precise signal discriminating clock by detecting such a phase shift in highly accurate fashion and compensating for the clock phase shift in an accurate matter.

FIG. 19 is a diagram showing the construction of the receiver section of a multiplexed radio apparatus according to the prior art. The receiver section has a clock regenerating circuit for identifying a demodulated signal in highly precise fashion.

(a) Overall Configuration

An intermediate-frequency signal IF-IN is obtained by applying frequency modulation to a received signal. The received signal has been subjected to multilevel quadrature modulation such as PSK or QAM (e.g., 16 QAM).

A quadrature detector 22 orthogonally detects the intermediate-frequency signal IF-IN and outputs two types of baseband signals (an I-channel signal Ich and a Q-channel signal Qch), which are 90° out of phase (i.e., in quadrature). AD converters 23, 24 respectively convert the I- and Q-channel signals Ich, Qch, which are output by the quadrature detector 22, to digital data. A transversal equalizer 25 applies equalization processing to the digital data output by the AD converters 23, 24. A clock phase signal generator 26 detects the phase components of a regenerated clock and outputs a clock phase signal. A clock regenerating circuit 27 regenerates a clock signal CLK synchronized to symbol clock that is included in the demodulated signal.

(b) Quadrature Detector

The quadrature detector 22 includes an intermediate-frequency amplifier 22$a$, a hybrid circuit (H) 22$b$ for branching the intermediate-frequency signal, a local oscillator 22$c$, which oscillates at a carrier frequency fc, a hybrid circuit 22$d$ for separating the output signal of the local oscillator 22$c$ into two signals that are 90° out of phase, mixer circuits 22$e$, 22$f$ for orthogonally detecting the intermediate-frequency signal by mixing it with two orthogonal signals and outputting baseband in-phase and quadrature signals Ich, Qch, respectively, and roll-off filters 22$g$, 22$h$ for imparting a roll-off characteristic to the baseband in-phase and quadrature signals Ich, Qch.

(c) Transversal Equalizer

The transversal equalizer 25 has the construction of a well-known two-dimensional transversal equalizer of the kind shown in FIG. 20. The transversal equalizer includes transversal filters 25$a$-1, 25$a$-2 for eliminating transmission path distortion of the I-channel signal, transversal filters 25$b$-1, 25$ba$-2 for eliminating transmission path distortion of the Q-channel signal, and subtractors 25$c$, 25$d$. The subtractor 25$c$ subtracts the Q-channel signal from the I-channel signal to cancel the quadrature component (Q-channel component) contained in the I-channel signal. The subtractor 25$d$ subtracts the I-channel signal from the Q-channel signal to cancel the quadrature component (I-channel component) contained in the Q-channel signal.

As will be described later, each of the transversal filters 25$a$-1–25$b$-2 is constituted by N-tap FIR filters in which the coefficients can be changed. The coefficients are decided so as to compensate for transmission path distortion. If the I- and Q-channel signals are each expressed by eight bits in 16 QAM, the two high-order bits represent data and the six low-order bits represent the error due to waveform distortion, etc. In case of data that is positive, the relationship between identification threshold values of two high-order bits and digital data is as illustrated in FIG. 21. (1) When a third bit E is "1", the digital data is greater than an intermediate value (the dashed line) of the identification threshold values. (2) When E is "0", the digital data is less than the intermediate value. In order to eliminate the effects of transmission path distortion, it will suffice to perform control in such a manner that the value of the six low-order bits will approach the intermediate value (the ideal value) of the identification threshold values.

Accordingly, in a case where data is positive, control is performed in such a manner that the output data of the transversal filter becomes small if E="1" holds and large if E="0" holds. In a case where data is negative, control is performed in such a manner that the output data of the transversal filter becomes large if E="1" holds and small if E="0" holds. The transversal filters 25$a$-1 25$b$-2 eliminate the influence of transmission path distortion by causing the coefficients of the FIR digital filters to converge toward predetermined values in accordance with the above-described logic.

An example of such a transversal filter is a five-tap transversal filter 250 shown in FIG. 22. The transversal filter 250 includes four delay circuits $251_1$–$251_4$ for successively delaying input data by one sampling time period (one symbol clock) at a time, coefficient decision/multiplier units $252_0$–$252_4$ for automatically deciding coefficients $C_2$–$C_{-2}$ based upon the polarity of the input data and of data D output by each of the delay circuits and an error signal E ("1", "0" of a third bit), and for multiplying the input data and the output data of the delay circuits by the coefficients $C_2$–$C_{-2}$, and adders $253_1$–$253_4$ for summing the products from the coefficient decision/multiplier units $252_0$–$252_4$.

FIG. 23 is a diagram illustrating the details of part of the transversal filter 250. Here the decision/multiplier units $252_0$, $252_1$ are shown in detail. The decision/multiplier units $252_0$, $252_1$ include exclusive-OR (EOR) circuits $EOR_1$, $EOR_2$, respectively, for obtaining the exclusive-OR between (a) the polarity of the input data and the polarity (the most significant bit MSB) D of the data output by the respective delay circuits and (b) the error signal E of the transversal filter, up/down counters $UDC_0$, $UDC_1$, respectively, for incrementing or decrementing the coefficients $C_2$, $C_1$ in dependence upon the output of the EOR circuit, and multipliers $MLP_0$, $MLP_1$, respectively, for multiplying the input data and delay circuit output data by the coefficients $C_2$, $C_1$, respectively.

The coefficient $C_2$ becomes one larger if the exclusive-OR of the polarity D of the input data and the error signal E is "1" and one smaller if the exclusive-OR is "0". The coefficient $C_1$ becomes one larger if the exclusive-OR of the output data polarity D of the delay circuit $251_1$ and the error signal E is "1" and one smaller if the exclusive-OR is "0". By virtue of this operation, the coefficient values are controlled in such a manner that the value (error) E of the third bit onward of the digital data output by the transversal filter will coincide with the intermediate value (the dashed line in FIG. 21) of the identification threshold levels.

(d) Clock Phase Signal Generator

The clock phase signal generator 26 includes a slope discriminator 30 for discriminating the slope G of the I-channel signal Ich (G="0" holds when the slope is positive and G="1" when the slope is negative), a subtractor 31 for calculating the error E between the input and output signals or the transversal equalizer 25, a delay circuit 32 for delaying the I-channel signal Ich by a predetermined symbol time τ, a delay circuit 33 for delaying the slope signal, which is output by the slope discriminator 30, by the time τ, an EOR circuit 34 for taking the exclusive-OR between the signs of the slope G and error signal E, and a loop filter 35, which is constituted by a resistor and capacitor, for smoothing the EOR output signal and outputting an analog clock phase signal CPS. The slope discriminator 30 comprises flip-flop (FF) circuits 30a, 30b and a ROM 30c. The flip-flop circuits 30a, 30b (which act as delay units) successively delay the output signal (I-channel signal) of the AD converter 23 by one symbol time period each, and the ROM (which acts as a comparator) 30c compares the outputs of the flip-flop circuits 30a, 30b to detect the slope of the I-channel signal Ich.

FIG. 24 is a diagram useful in describing clock phase control in a case where the slope G of the I-channel signal is positive (i.e., when G="0" holds). The I-channel signal prior to equalization is shown at 1a, and the I-channel signals after equalization are shown at 1b, 1c. When the I-channel signal is equalized by E in the transversal equalizer 25, the subtractor 31 outputs the error signal E. The sign of the error signal E is negative ("0") if the value before equalization is greater than the value after equalization and positive ("1" if the value before equalization is less than the value after equalization.

If the error signal E is negative ("0"), then the phase of the I-channel 1b signal after equalization lags that of the I-channel signal 1a before equalization by Δt, as shown by the waveforms in FIG. 24. This indicates that the eye pattern is open to the maximum degree and that the phase of the AD conversion clock (the regenerated clock) lags the optimum phase by Δt. If the error signal E is positive ("1"), on the other hand, then the phase of the I-channel signal 1c after equalization leads that of the I-channel signal 1a before equalization by Δt.

Accordingly, in a case where the slope of the I-channel signal is positive (G="0"), as shown in the table TB in FIG. 24, (1) control is performed in a direction that will delay the phase of the regenerated clock by Δt if the error signal E is positive (="1") (phase shift direction: delay direction="1"), and (2) control is performed in a direction that will advance the phase of the regenerated clock by Δt if the error signal E is negative (="0") (phase shift direction: advance direction="0").

FIG. 25 is a diagram useful in describing clock phase control in a case where the slope G of the I-channel signal is negative (i.e., when G="1" holds). The I-channel signal prior to equalization is shown at 1a, and the I-channel signals after equalization are shown at 1b, 1c. If the error signal E is negative ("0"), then the phase of the I-channel 1b signal after equalization leads that of the I-channel signal 1a before equalization by Δt, as shown by the waveforms in FIG. 25. If the error signal E is positive ("1"), on the other hand, then the phase of the I-channel signal 1c after equalization lags that of the I-channel signal 1a before equalization by Δt. Accordingly, in a case where the slope of the I-channel signal is negative (G="1"), as shown in the table TB in FIG. 25, (1) control is performed in a direction that will advance the phase of the regenerated clock by Δt if the error signal E is positive (="1") (phase shift direction: advance direction="0"), and (2) control is performed in a direction that will delay the phase of the regenerated clock by Δt if the error signal E is negative (="0") (phase shift direction: delay direction="1").

Thus, it will suffice to perform phase control in a direction that will advance the clock phase if the output of the EOR circuit 34 is "0" and in a direction that will delay the clock phase if the output of the EOR circuit 34 is "1". Accordingly, if the output of the EOR circuit 34 is smoothed, the smoothed value will take on a value commensurate with the clock phase and, hence, the loop filter 35 will output the phase signal CPS having a value conforming to the clock phase.

(e) Clock Generator

The clock generator 27 has an oscillator, e.g. a voltage-controlled oscillator (VCO) 36, for outputting a clock signal having a frequency conforming to a control signal, and an amplifier 37 for amplifying the clock phase signal CPS to output a control signal. The oscillator 36 controls the clock phase by a control signal conforming to the phase shift of the clock in such a manner that the phase shift becomes zero. A loop comprising the AD converter 23→clock phase signal generator 26→clock regenerating circuit 27→AD converter 23 constructs a PLL that causes the regenerated clock to coincide with the phase of the symbol clock. If a shift develops between the phase of the regenerated clock output by the oscillator 36 and the phase of the symbol clock, the error E is produced between the input and output signals of the transversal equalizer 25. If the error signal E is produced, then the clock phase signal generator 26 uses the slope G of the I-channel signal Ich and the sign of the error signal E to generate the clock phase signal CPS having a value conforming to the phase shift, and the clock regenerating circuit 27 controls the phase of the regenerated clock by the clock phase signal CPS and performs control so as to eliminate the phase difference.

Though the clock regenerating circuit 27 detects the phase shift of the regenerated clock by the clock phase signal generator 26 provided on the side of the I channel, an arrangement may be adopted in which a similar clock phase signal generator 26 is provided on the side of the Q channel and detects the phase shift of the regenerated clock from the Q-channel signal $Q_{ch}$.

By virtue of the foregoing operation, the regenerated clock CLK output by the clock regenerating circuit 27 can be made to coincide at all times with the optimum phase at which the eye pattern opens to the maximum extent, thereby making it possible to improve greatly the accuracy of the AD conversion processing executed by the AD converters 23, 24.

(f) Example Using Decision Feedback Equalizer

FIG. 26 is a diagram showing the construction of a receiver demodulator in a case where the transversal filter 25 is constituted by a decision feedback equalizer according to the prior art. Components identical with those shown in FIG. 19 are designated by like reference characters.

The decision feedback equalizer is used to equalize interference between codes caused by frequency selective phasing produced in the propagation path of a digital radio communication system and includes a front equalizer 25A and a back equalizer 25B. The decision feedback equalizer 25 has a center tap coefficient $\alpha_0$ which acts in the same manner as an AGC circuit. Since the center tap can be external to the equalizer, it is brought to the exterior as AGC circuits 28, 29 in the illustration.

FIG. 27 is a diagram showing the construction of the decision feedback equalizer 25 according to the prior art. The front equalizer 25A is constituted by a front tap coefficient section obtained when the four transversal filters (FIR filters) 25a-1–25a-2, 25b-1–25b-2 are separated into two sections about the center tap. The back equalizer 25B is constituted by a back tap coefficient section.

The front equalizer 25A has FIR filters 25a-11–25a-21 of tap coefficients $\alpha_{-n}$–$\alpha_{-1}$, $\alpha_0$, FIR filters 25b-11–25b-21 of tap coefficients $\beta_{-n}$–$\beta_{-1}$, $\beta_0$, and subtractors 25c-1, 25d-1. Each FIR filter has a forward-type construction.

The FIR filters 25a-11–25a-21 of the front equalizer 25A each successively delay 8-bit 16 QAM data (in which the high-order two bits represent data and the low-order six bits represent the error due to waveform distortion) of the entered I channel by delay units $Z^{-1}$, multiply the output data of the delay units by the tap coefficients $\alpha_{-n}$–$\alpha_{-1}$, $\alpha_0$ ($\alpha_0=1$ in case of the FIR filter 25a-11), sum the products and output the result. The FIR filters 25b-11–25b-21 successively shift 8-bit 16 QAM data of the entered Q channel by delay units $Z^{-1}$, multiply the output data of the delay units by the tap coefficients $\beta_{-n}$–$\beta_{-1}$, $\beta_0$, sum the products and output the result. The subtractor 25c-1 subtracts the Q-channel signal from the I-channel signal to thereby cancel the quadrature component (the Q-channel component) contained in the I-channel signal. The subtractor 25d-1 subtracts the I-channel signal from the Q-channel signal to thereby cancel the quadrature component (the I-channel component) contained in the Q-channel signal.

The back equalizer 25B has FIR filters 25a-12–25a-22 of tap coefficients $\alpha_1$–$\alpha_n$, FIR filters 25b-12–25b-22 of tap coefficients $\beta_1$–$\beta_n$, subtractors 25c-2, 25d-2, delay units 25e, 25f for delaying data by one symbol time period each, and discrimination units 25g, 25h for discriminating the levels of the digital data after equalization and feeding the levels back to the FIR filters 25a-12–25a-22, 25b-12–25b-22. Each of the FIR filters 25a-12–25a-22, 25b-12–25b-22 has a backward-type construction.

The FIR filter 25a-12 of the back equalizer 25B successively shifts the I-channel signal, which has entered as feedback, by delay units $Z^{-1}$, multiplies the output data of the delay units by the tap coefficients $\alpha_1$–$\alpha_n$, sums the products and outputs the result. The FIR filter 25a-22 successively shifts the I-channel signal, which has entered as feedback, by delay units $z^{-1}$, multiplies the output data of the delay units by the tap coefficients $\alpha_1$–$\alpha_n$, sums the products and outputs the result.

The FIR filter 25b-12 successively shifts the Q-channel signal, which has entered as feedback, by delay units $Z^{-1}$, multiplies the output data of the delay units by the tap coefficients $\beta_1$–$\beta_n$, sums the products and outputs the result. The FIR filter 25b-22 successively shifts the Q-channel signal, which has entered as feedback, by delay units $Z^{-1}$, multiplies the output data of the delay units by the tap coefficients $\beta_1$–$\beta_n$, sums the products and outputs the result.

The subtractor 25c-2 subtracts the Q-channel signal from the I-channel signal to thereby cancel the quadrature component (the Q-channel component) contained in the I-channel signal, and the delay unit 25e outputs the result of subtraction upon delaying it by one symbol timing period. The discriminating unit 25g discriminates the level of the result of subtraction and feeds the result of discrimination back to the FIR filters 25a-12, 25a-22. The subtractor 25d-2 subtracts the I-channel signal from the Q-channel signal to thereby cancel the quadrature component (the I-channel component) contained in the Q-channel signal, and the delay unit 25f outputs the result of subtraction upon delaying it by one symbol timing period. The discriminating unit 25h discriminates the level of the result of subtraction and feeds the result of discrimination back to the FIR filters 25b-12, 25b-22.

In accordance with the decision feedback equalizer, data from which noise and interference components contained in the equalized digital data have been removed is fed back. As a result, tap coefficients can be made to converge correct values and the performance of the equalizer can be improved.

The prior-art radio receivers shown in FIG. 19 and 26 require that the error signal between the input and output signals of the transversal equalizer 25 be calculated. This makes it necessary to provide the delay circuit 32 and subtractor circuit 31 to delay the input signal by the time $\tau$, which corresponds to the delay time of the transversal equalizer 25. The input signal is expressed by eight bits in case of 16 QAM, and the delay time of the transversal equalizer is 20 symbol clocks (20 sampling periods). Consequently, eight shift registers each having a length of 20 bits are required as the delay circuit 32. This means that the conventional radio receiver involves a large amount hardware. Simplification of the apparatus, therefore, is required.

Further, with the radio receiver according to the prior art, the regenerated clock can be synchronized to the symbol clock owing to the PLL arrangement but there is a need to regenerate a more accurate clock.

When deep phasing occurs, the tap coefficients of the FIR filters constructing the transversal equalizer take on large values. When this occurs, the error due to the phase shift of the clock CLK becomes imbedded and the accuracy of the regenerated clock phase declines. Accordingly, there is a need to regenerate a clock accurately even when phasing occurs.

SUMMARY OF THE INVENTION

Accordingly, an object of the present invention is to provide a radio receiving apparatus that is simplified by reducing the number of components.

Another object of the present invention is to provide a radio receiving apparatus in which the clock regeneration performance of a radio receiver section is improved to raise the phase accuracy of the regenerated clock.

Still another object of the present invention is to provide a radio receiving apparatus capable of regenerating a clock accurately even when phasing occurs.

In accordance with the present invention, the foregoing objects are attained by providing a radio receiving apparatus for regenerating a clock synchronized to a symbol clock contained in a quadrature demodulated signal obtained by demodulating a multilevel quadrature modulated signal, AD converting the quadrature demodulated signal at the timing at which the regenerated clock occurs, and outputting data, which has been obtained by the AD conversion, via a transversal equalizer, comprising (1) a clock generating circuit for generating a clock synchronized to the symbol clock, (2) a slope discriminator for obtaining the slope of one signal of an in-phase signal (I-channel signal) and quadrature signal (Q-channel signal) input to the transversal equalizer, (3) means for outputting, as an error signal that takes into account a signal delay time between input and output signals of the transversal equalizer, an output signal of a filter when a center tap coefficient $\alpha_0$ of the filter is regarded as being zero, the filter constituting the transversal equalizer to which the above-mentioned one signal is input, and (4) a clock phase detector for outputting a phase signal, which conforms to a phase difference between the regenerated clock and the symbol clock, using the slope and the error signal, wherein the clock regenerating circuit controls the phase of the regenerated clock based upon the phase signal, and an AD converter AD converts the quadrature demodulated signal at the timing at which the regenerated clock occurs and outputs the AD-converted signal via the transversal equalizer.

Further, in accordance with another aspect of the present invention, the foregoing objects are attained by providing a radio receiving apparatus for regenerating a clock synchronized to a symbol clock contained in a quadrature demodulated signal obtained by demodulating a multilevel quadrature modulated signal, AD converting the quadrature demodulated signal at the timing at which the regenerated clock occurs, and outputting data, which has been obtained by the AD conversion, via an equalizer circuit having a front equalizer and a back equalizer, comprising (1) a clock generating circuit for generating a clock synchronized to the symbol clock, (2) a slope discriminator for obtaining the slope of one signal of an in-phase signal (I-channel signal) and quadrature signal (Q-channel signal) input to the front equalizer, (3) means for adopting, as an error signal (a first error signal) between input and output signals of the front equalizer, an output signal of a filter, which constitutes the front equalizer, when a tap coefficient $\alpha_0$ of the filter is regarded as being zero, (4) means for adopting, as an error signal (a second error signal) between input and output signals of the back equalizer, an output signal of a filter of the back equalizer when an output signal of the front equalizer that enters the filter of the back equalizer is regarded as being zero, and (5) a clock phase detector for outputting a phase signal, which conforms to a phase difference between the regenerated clock and the symbol clock, using the slope and each error signal, wherein the clock regenerating circuit controls the phase of the regenerated clock based upon the phase signal, and an AD converter AD converts the quadrature demodulated signal at the timing at which the regenerated clock occurs and outputs the AD-converted signal via the equalizer circuit.

In accordance with a preferred embodiment of the invention, the clock phase detector of the radio receiving apparatus includes (1) a first circuit for outputting a first signal, which conforms to a clock phase difference, based upon a combination of the sign of the slope and the sign of the first error signal, (2) a second circuit for outputting a second signal, which conforms to a clock phase difference, based upon a combination of the sign of the slope and the sign of the second error signal, and (3) a combining circuit for combining the first and second signals to output a phase signal.

In accordance with a preferred embodiment of the invention, the clock phase detector of the radio receiving apparatus includes (1) a first circuit for outputting a first signal, which conforms to a clock phase difference, based upon a combination of the sign of the slope and the sign of the first error signal, (2) a second circuit for outputting a second signal, which conforms to a clock phase difference, based upon a combination of the sign of the slope and the sign of the second error signal, (3) a combining circuit for combining the first and second signals to output a phase signal, (4) a phasing discriminator for determining whether a prevailing state is a minimum phasing state in which an interference wave lags behind a main wave or a non-minimum phasing state in which a main wave lags behind an interference wave, (5) means for selectively inputting the first and second signals to the combining circuit, or for inputting the first and second signals to the combining circuit upon changing weighting thereof, based upon the determination made by the phasing discriminator.

Other features and advantages of the present invention will be apparent from the following description taken in conjunction with the accompanying drawings.

BRIEF DESCRIPTION OF THE DRAWINGS

DESCRIPTION OF THE PREFERRED EMBODIMENTS (A) Overview of the Invention (a) General Construction FIGS. 1A, 1B are block diagrams showing the general construction of the present invention, in which FIG. 1A shows an arrangement in which a transversal equalizer has not been separated into front and back equalizers, and FIG. 1B shows an arrangement in which a transversal equalizer has been separated into front and back equalizers.

Figure 1A:
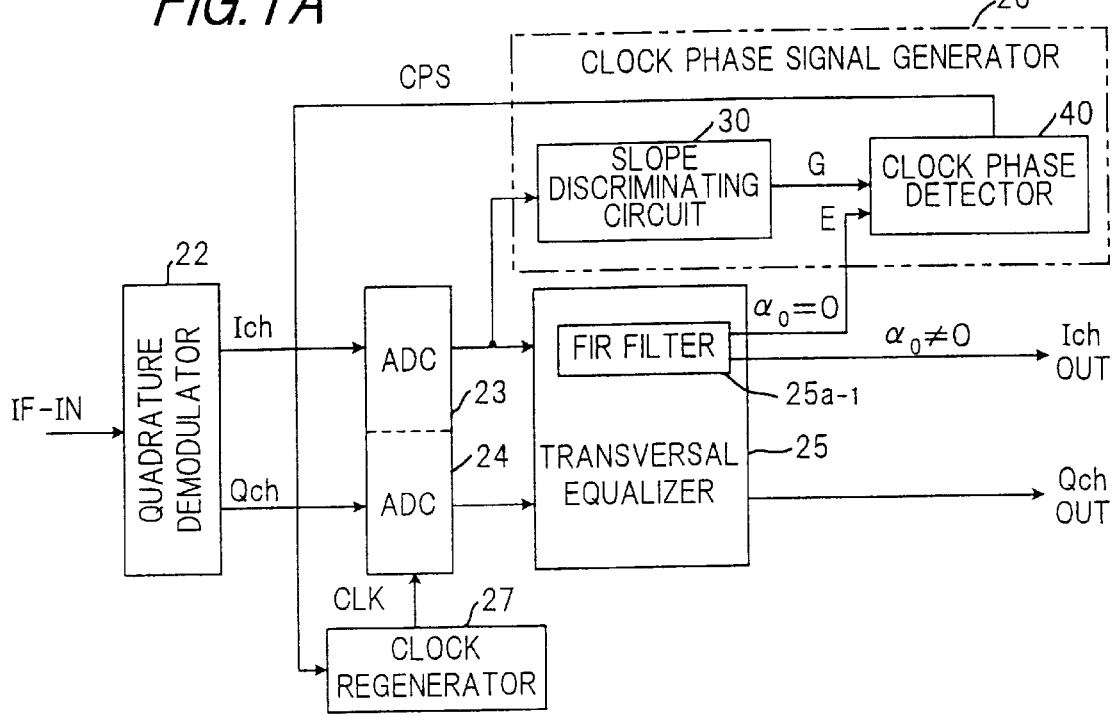
FIGS. 1A and 1B are block diagram illustrating the principles and configuration of the present invention.

A quadrature demodulator 22 demodulates a multilevel quadrature modulated signal and outputs an in-phase signal (I-channel signal) Ich and a quadrature signal (Q-channel signal) Qch. AD converters 23, 24 respectively convert the I- and Q-channel signals Ich, Qch to digital data. A transversal equalizer 25 comprises FIR filters having (2n+1) taps. Reference characters 25A, 25B denote a front equalizer, which comprises FIR filters having tap coefficients $\alpha_{-n}-\alpha_1$, and a back equalizer, which comprises FIR filters having tap coefficients $\alpha_1-\alpha_n$, respectively. A clock phase signal generator 26 outputs a clock phase signal CPS, which conforms to a phase difference between a regenerated clock and a symbol clock. A clock regenerating circuit 27 generates a clock CLK that is synchronized to the symbol clock. A slope discriminator 30 obtains the slope G of the I-channel signal, and a clock phase detector 40 detects the phase difference between the regenerated clock and the symbol clock using the slope G and error signals E, E1, E2 between the input and output signals of the transversal equalizer, and outputs the clock phase signal CPS that conforms to this phase difference.

(b) Overview of First Solution (FIG. 1A)

The slope discriminator 30 outputs the slope G of the I-channel signal Ich, and a FIR filter 25a-1 in the transversal equalizer 25 outputs the error signal E between the input and output signals of the transversal equalizer 25 by regarding the center tap coefficient $\alpha_0$ of the FIR filter 25a-1 as being zero. Using the slope G and the error signal E, the clock phase detector 40 outputs the clock phase signal CPS, which conforms to the phase difference between the regenerated clock and the symbol clock. The clock regenerating circuit 27 controls the phase of the regenerated clock based upon the phase signal CPS, and the AD converters 23, 24 convert the analog quadrature modulated signals to digital data at the timing at which the regenerated clock occurs and output the digital data via the transversal equalizer 25. In this case the clock phase detector 40 is provided with a circuit for outputting a signal conforming to the clock phase difference on the basis of the sign of the slope G and the sign of the error signal E, and an averaging circuit for averaging the value of this signal and outputting a phase signal.

In accordance with this arrangement, delay circuits and subtractor circuits can be reduced in number, thereby making it possible to simplify the construction of the radio receiving apparatus.

Figure 1B:
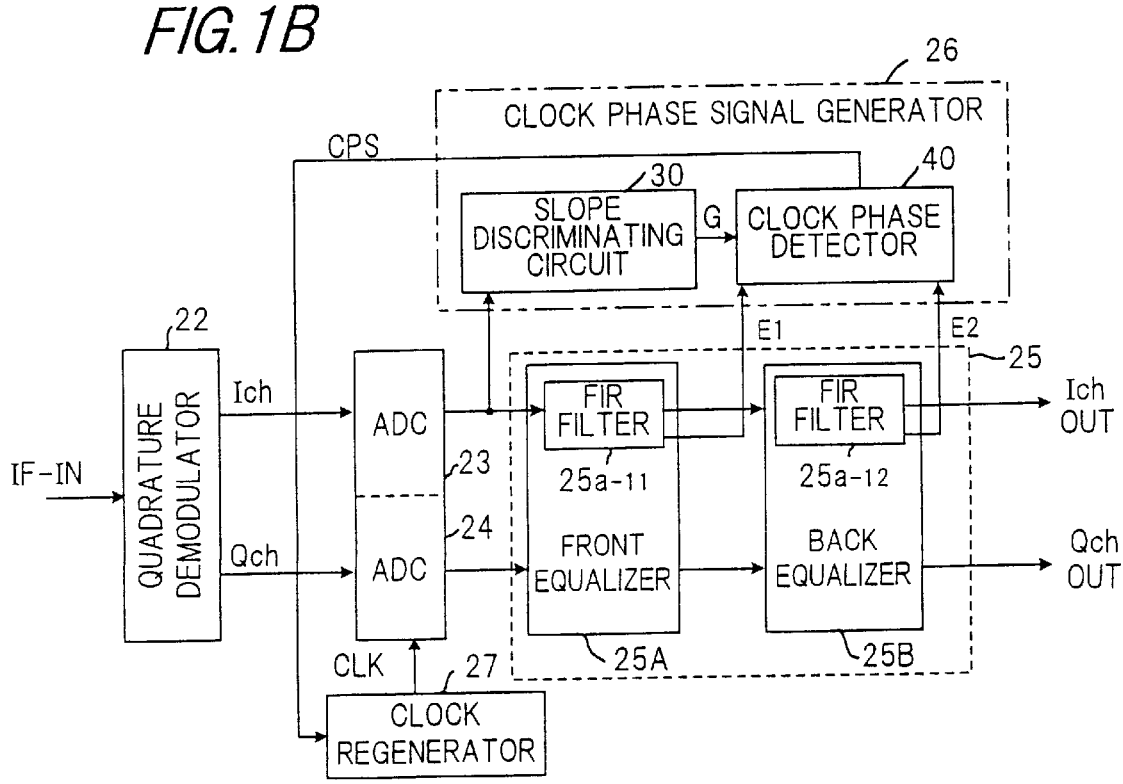

(c) Overview of Second Solution (FIG. 1B)

The slope discriminator 30 outputs the slope G of the I-channel signal Ich, which has entered the front equalizer 25A, and a FIR filter 25a-11 constituting the front equalizer 25A outputs an error signal (first error signal) E1 between the input and output signals of the front transversal equalizer by regarding the tap coefficient $\alpha_0$ of the FIR filter 25a-11 as being zero. Further, a FIR filter 25a-12 constituting the back equalizer 25B outputs an error signal (second error signal) E2 between the input and output signals of the back equalizer 25B by regarding the output signal of the front equalizer 25A, which enters the FIR filter 25a-12 of the back equalizer 25B, as being zero. Using the slope G and the error signals E1 and E2, the clock phase detector 40 outputs the phase signal CPS, which conforms to the phase difference between the regenerated clock and the symbol clock. The clock regenerating circuit 27 controls the phase of the regenerated clock based upon the phase signal, and the AD converters 23, 24 convert the analog quadrature modulated signals to digital data at the timing at which the regenerated clock occurs and output the digital data via the front equalizer 25A and back equalizer 25B.

In accordance with this arrangement, delay circuits and subtractor circuits can be reduced in number, thereby making it possible to simplify the construction of the radio receiving apparatus, even in a case where the equalizer circuit consists of a front equalizer and a back equalizer.

In this case, the front and back equalizers may construct a decision feedback equalizer, or a transversal equalizer may simply be separated into two halve at the center tap.

Further, an arrangement may be adopted in which a first signal, which conforms to the clock phase, is generated based upon a combination of the sign of the slope of the input signal (I-channel signal) of the front equalizer and the sign of the first error signal, the slope of the input signal of the back equalizer is obtained, a second signal conforming to the clock phase is generated based upon a combination of the sign of the slope of the input signal of the back equalizer and the sign of the second error signal, and the first and second signals are combined to control the clock phase. If it is thus so arranged that the discrimination of the slope is performed independently at the front and back equalizers, the number of slope discriminators is increased by one but it possible to obtain correct signal slopes conforming to the front and back equalizers and the accuracy of the regenerated clock can be improved.

(d) Overview of Third Solution (To Deal with Phasing)

Here the clock phase detector 40 includes (1) a first circuit for outputting a first signal, which conforms to the clock phase, based upon a combination of the sign of the slope G of the input signal of the front equalizer and the sign of the first error signal E1, (2) a second circuit for outputting a second signal, which conforms to the clock phase, based upon a combination of the sign of the slope and the sign G of the second error signal E2, (3) a phasing state discriminator for determining whether a prevailing state is a minimum phasing state in which an interference wave lags behind a main wave or a non-minimum phasing state in which a main wave lags behind an interference wave, (4) a signal output unit which, based upon the phasing determination, switches between and outputs the first and second signals used in clock phase detection or changes the weighting of the first and second signals, combines the signals and then outputs the combined signal, and (5) an averaging circuit for averaging the signal value output by the signal output unit and outputting the phase signal CPS having a value conforming to the phase difference.

When deep phasing occurs, the tap coefficients of the FIR filters constructing the transversal equalizer take on large values. As a result, an error due to a clock phase shift becomes imbedded and the accuracy of the regenerated clock pulses declines. Accordingly, if phase control is carried out utilizing the error signal of the smaller tap coefficients when phasing occurs, the decline in the accuracy of clock regeneration can be suppressed. In general, multipath phasing includes a minimum phase (MP), in which the interference wave lags behind the main wave, and a non-minimum phase (NMP), in which the main wave lags behind the interference wave. The coefficients of the back equalizer 25B of the transversal equalizer primarily indicate large values in case of the minimum phase MP. In the case of the non-minimum phase NMP, the coefficients of the transversal equalizer 25A mainly take on large values. By utilizing this fact, it is possible to identify the particular phase of phasing, and the decline in the accuracy of clock regeneration can be suppressed by performing phase control, based upon the identified phase, using the error signal of the equalizer having the smaller tap coefficient values. This makes it possible to withstand deep phasing.

(e) Overview of Fourth Solution (To Improve Performance)

The clock phase detector 40 controls the phase signal CPS based upon the slope of the input signal of the back equalizer 25B and an error included in the output signal of the back equalizer 25B. This makes it possible to improve resistance to deep phasing and to provide greater regenerated clock accuracy.

Further, a first tap coefficient value $\alpha_{-1}$ of a FIR filter in the front equalizer 25A and $-\alpha_1$, which is obtained by reversing the sign of the first tap coefficient value of a FIR filter in the back equalizer 25B, are added, and the clock phase detector 40 controls the value of the phase signal CPS based upon the sum $(-\alpha_1+\alpha_{-1})$. If the clock phase shifts from the ideal point, the tap coefficient is changed. The change in the tap coefficient value is represented by $(-\alpha_1+\alpha_{-1})$. Accordingly, the accuracy of the clock can be improved by using this component in clock phase control.

Furthermore, a quadrature first tap coefficient $\beta_{-1}$ of the front equalizer 25A and a quadrature first tap coefficient $\beta_1$ of the back equalizer 25B are added and the tap coefficients $\beta_{-1}$, $\beta_1$ are compared in terms of size. The clock phase detector 40 controls the value of the phase signal CPS on the basis of the value $-(\beta_{-1}+\beta_1)$, which is obtained by reversing the sign of the sum, in a case where the inequality $\beta_1<\beta_{-1}$ holds, and on the basis of the sum $(\beta_{-1}+\beta_1)$ in a case where the inequality $\beta_1>\beta_{-1}$ holds. Though the tap coefficient on the quadrature side generally cannot be utilized as a value indicating the clock phase, it can be utilized when deep phasing occurs, thus making it possible to improve the accuracy of the regenerated clock.

(B) First Embodiment

Figure 2:
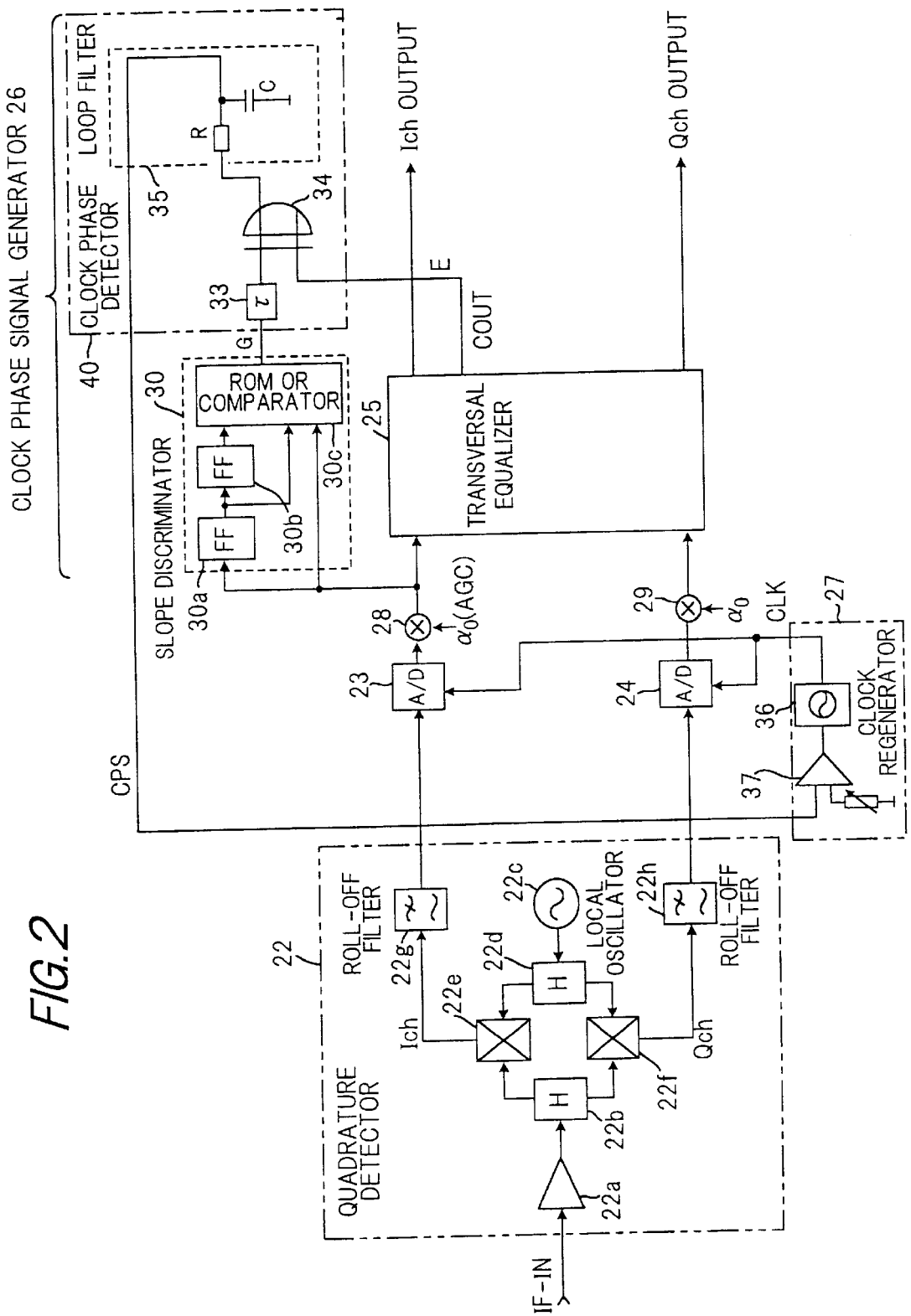
FIG. 2 is a diagram showing the construction of a radio receiving apparatus according to a first embodiment of the present invention.
Figure 19:
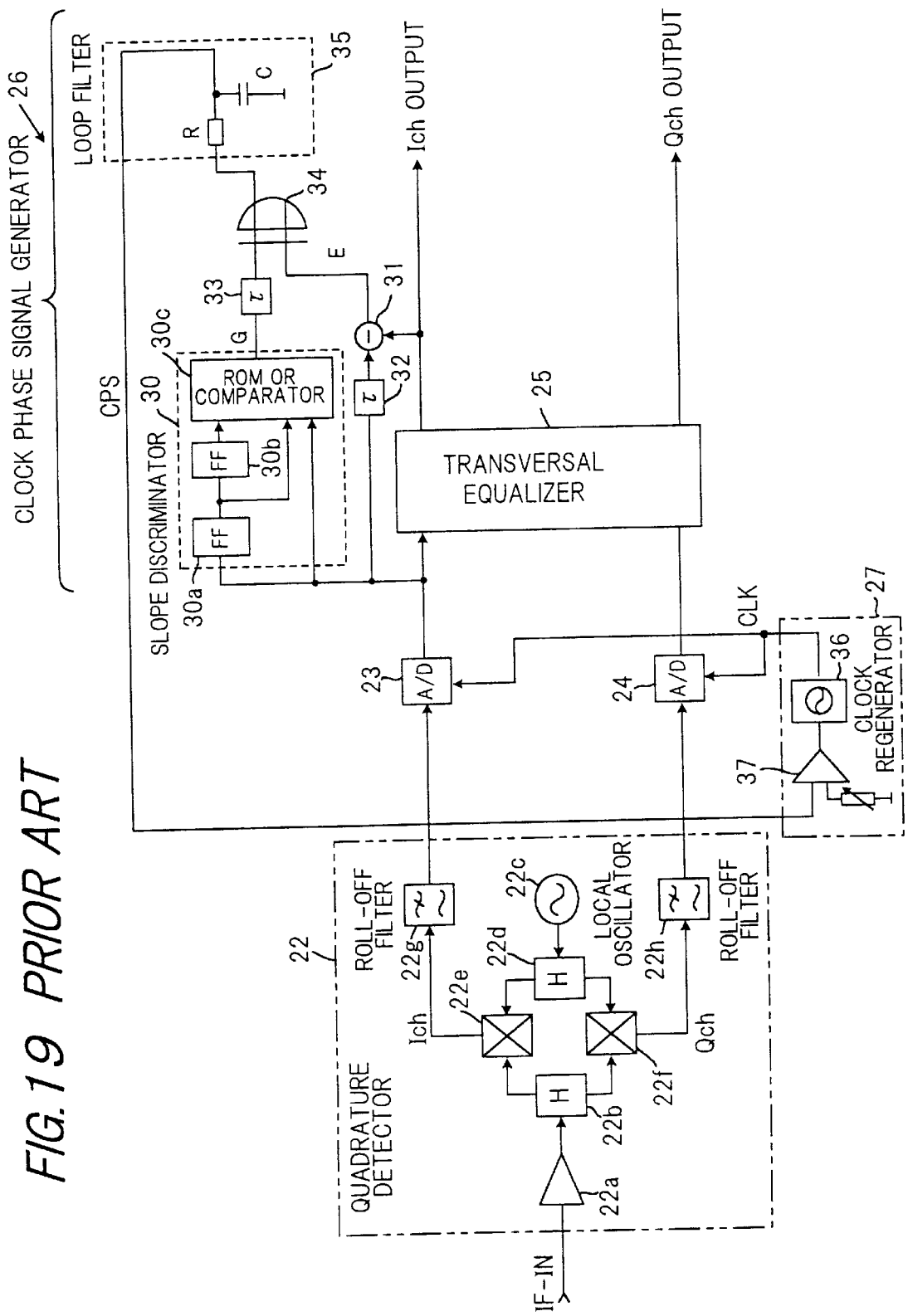
FIG. 19 is a diagram showing the construction of the receiver section of a multiplexed radio apparatus according to the prior art.

FIG. 2 is a diagram showing the construction of a radio receiving apparatus according to a first embodiment of the present invention. Components identical with those shown in the prior-art example of FIG. 19 are designated by like reference characters. It should be noted that the received signal has been subjected to multilevel quadrature modulation such as PSK or QAM (16 QAM in this embodiment).

The quadrature detector 22 orthogonally detects the intermediate-frequency signal IF-IN and outputs two types of baseband signals (an I-channel signal Ich and a Q-channel signal Qch), which are 90° out of phase (i.e., in quadrature). The AD converters 23, 24 respectively convert the analog I- and Q-channel signals Ich, Qch, which are output by the quadrature detector 22, to 8-bit digital data. The transversal equalizer 25 applies equalization processing to the digital data output by the AD converters 23, 24. If the I- and Q-channel signals are each expressed by eight bits in 16 QAM, the two high-order bits represent data and the six low-order bits represent the error due to waveform distortion, etc.

The clock phase signal generator 26 detects the phase of the regenerated clock and outputs the phase signal CPS. The clock regenerating circuit 27 regenerates the clock signal CLK synchronized to the symbol clock that is included in the demodulated signal. Numerals 28, 29 denote AGC circuits of gain $\alpha_0$, where $\alpha_0$ corresponds to the center tap coefficient of a FIR filter in the transversal equalizer 25.

The quadrature detector 22 includes the intermediate-frequency amplifier 22a, the hybrid circuit (H) 22b for branching the intermediate-frequency signal, the local oscillator 22c, which oscillates at the carrier frequency fc, the hybrid circuit 22d for separating the output signal of the local oscillator 22c into two signals that are 90° out of phase, the mixer circuits 22e, 22f for orthogonally detecting the intermediate-frequency signal by mixing it with two orthogonal signals and outputting baseband in-phase and quadrature signals Ich, Qch, respectively, and the roll-off filters 22g, 22h for imparting a roll-off characteristic to the baseband in-phase and quadrature signals Ich, Qch.

Figure 3:
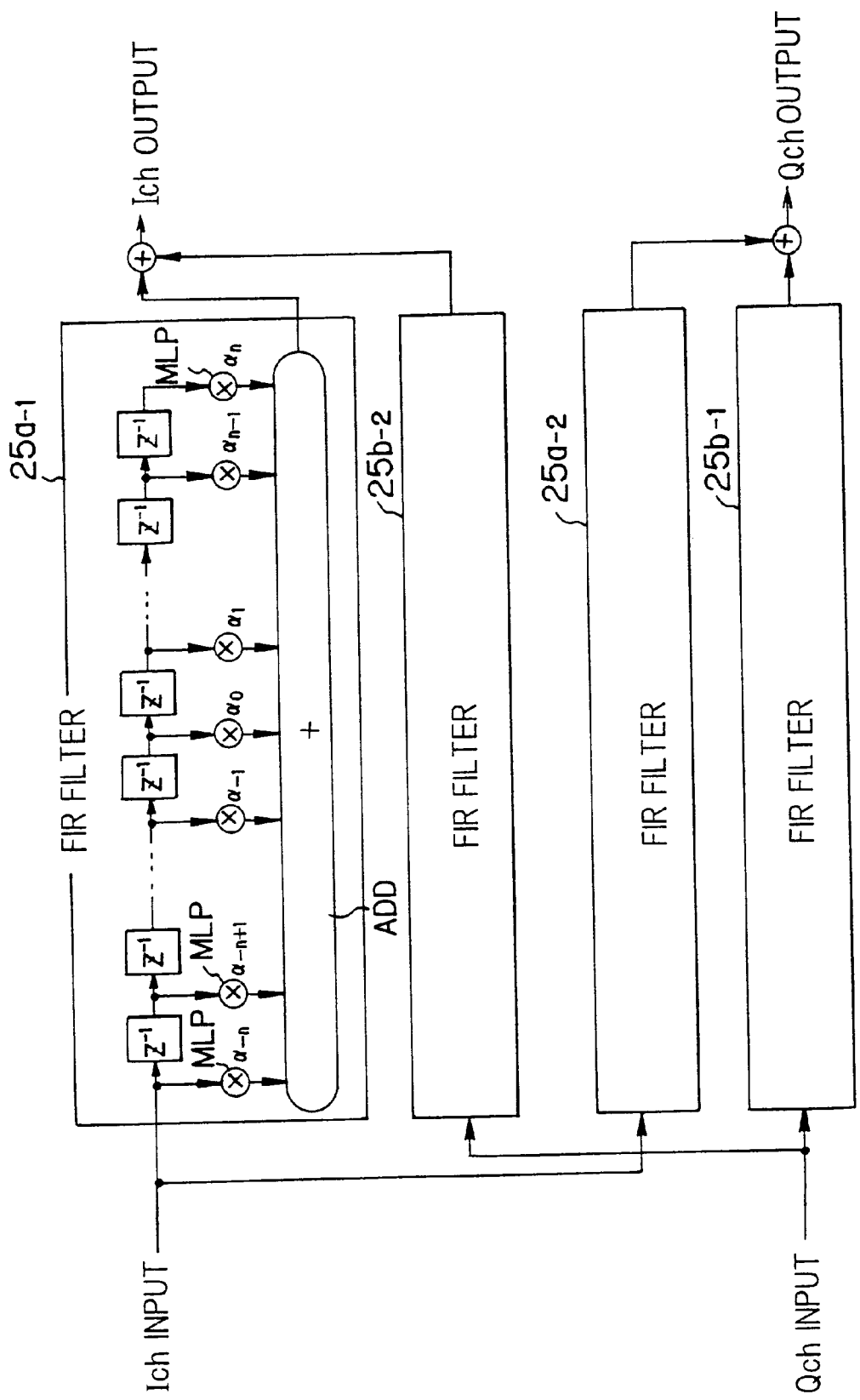
FIG. 3 is a diagram showing the construction of a transversal equalizer.
Figure 4:
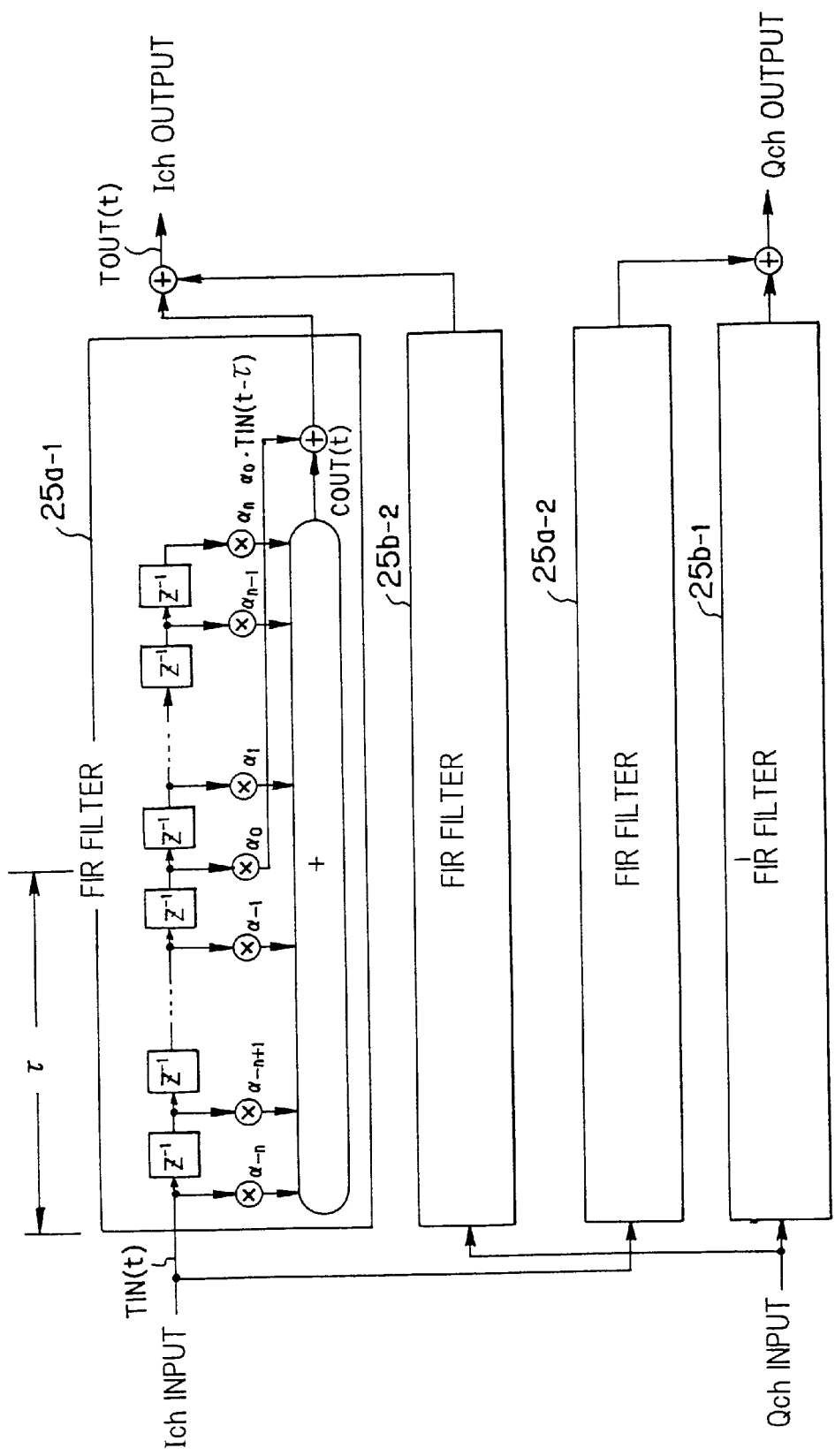
FIG. 4 is a diagram showing the construction of an actual transversal equalizer.
Figure 20:
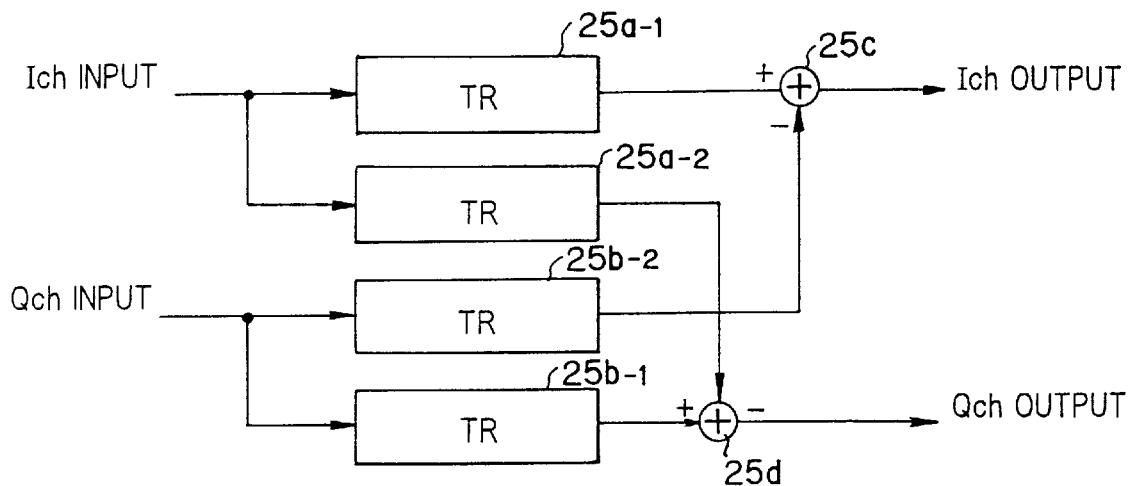
FIG. 20 is a diagram showing the construction of a transversal equalizer according to the prior art.
Figure 21:
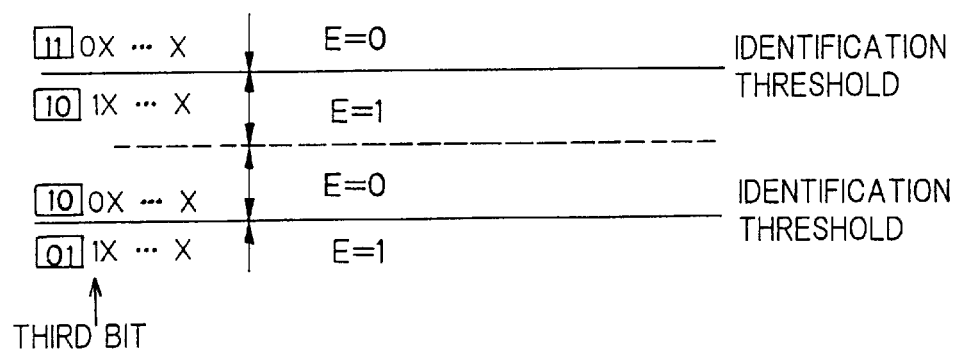
FIG. 21 is a diagram showing the relationship between identification threshold values and digital data.

The transversal equalizer 25 is composed of four FIR filters 25a-1, 25a-2 and 25b-1, 25b-2, as shown in FIG. 3. The arrangement is the same as that shown in FIG. 20. Here the transversal equalizer 25 actually is obtained by a slight modification of the construction of the FIR filter 25a-1, as shown in FIG. 4. The reason for this is to eliminate the subtractor circuit 31 and delay circuit 19 of FIG. 19. This will be described below.

Figure 22:
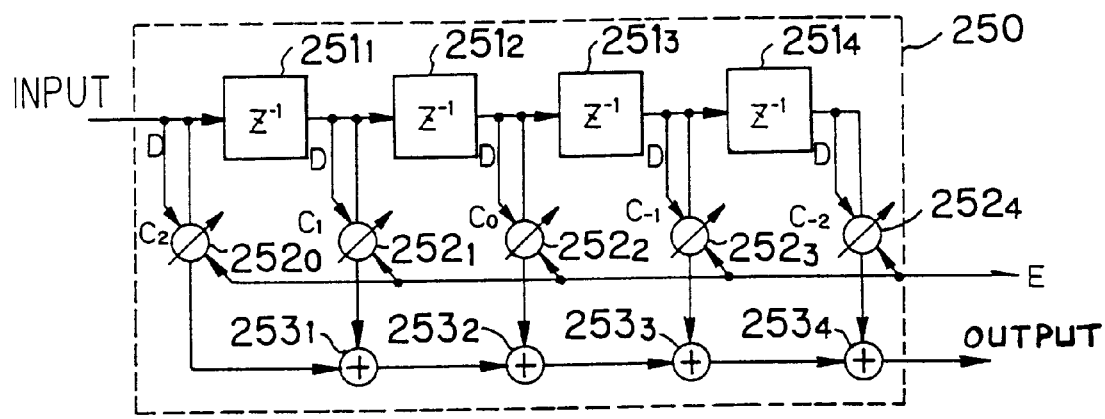
FIG. 22 is a diagram showing an example of a transversal filter (of five-tap type) according to the prior art.
Figure 23:
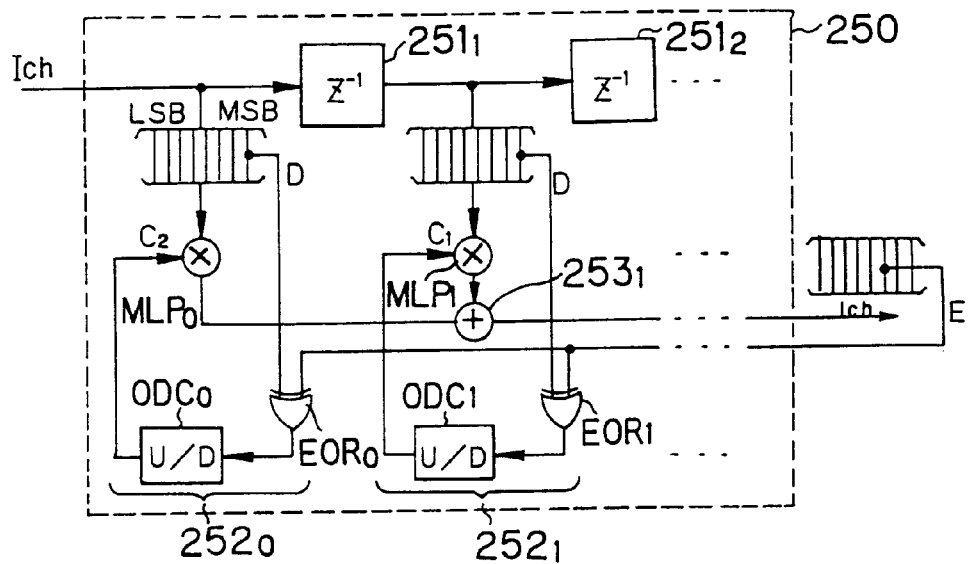
FIG. 23 is a diagram illustrating the details of construction of the transversal filter according to the prior art.
Figure 24:
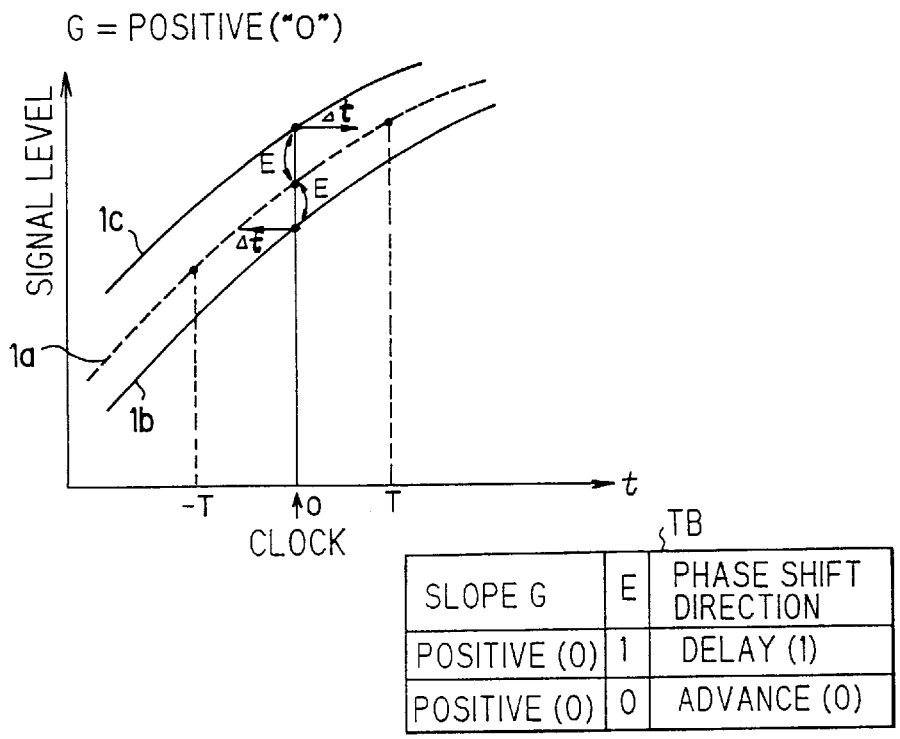
FIG. 24 is a diagram useful in describing clock phase control according to the prior art in a case where the slope of an I-channel signal is positive.
Figure 25:
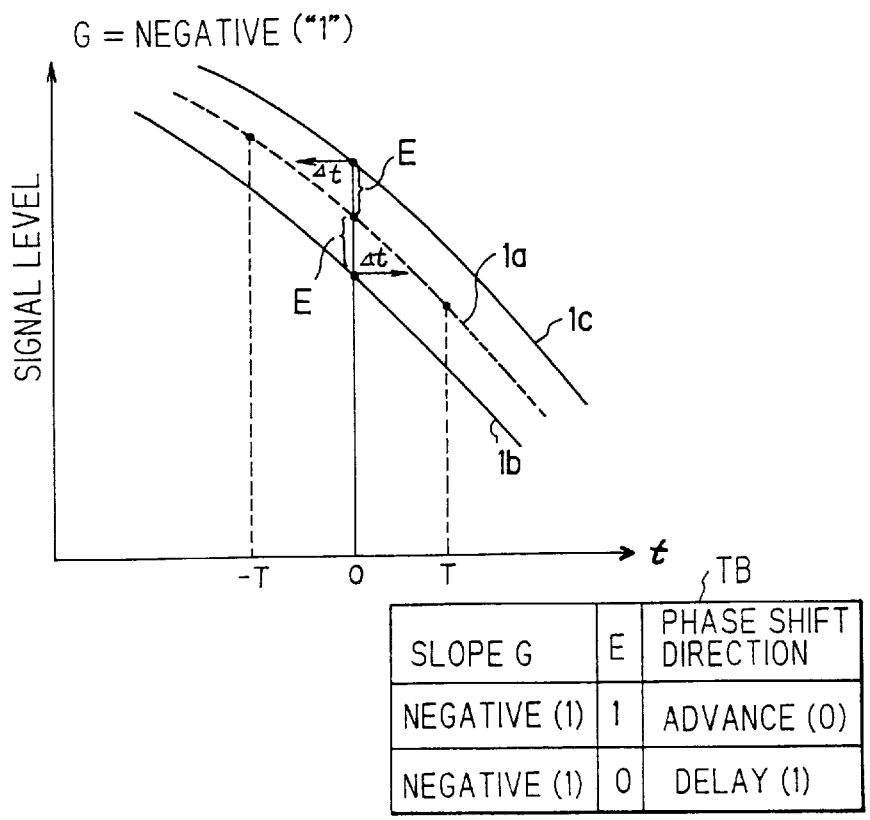
FIG. 25 is a diagram useful in describing clock phase control according to the prior art in a case where the slope of an I-channel signal is negative.
Figure 26:
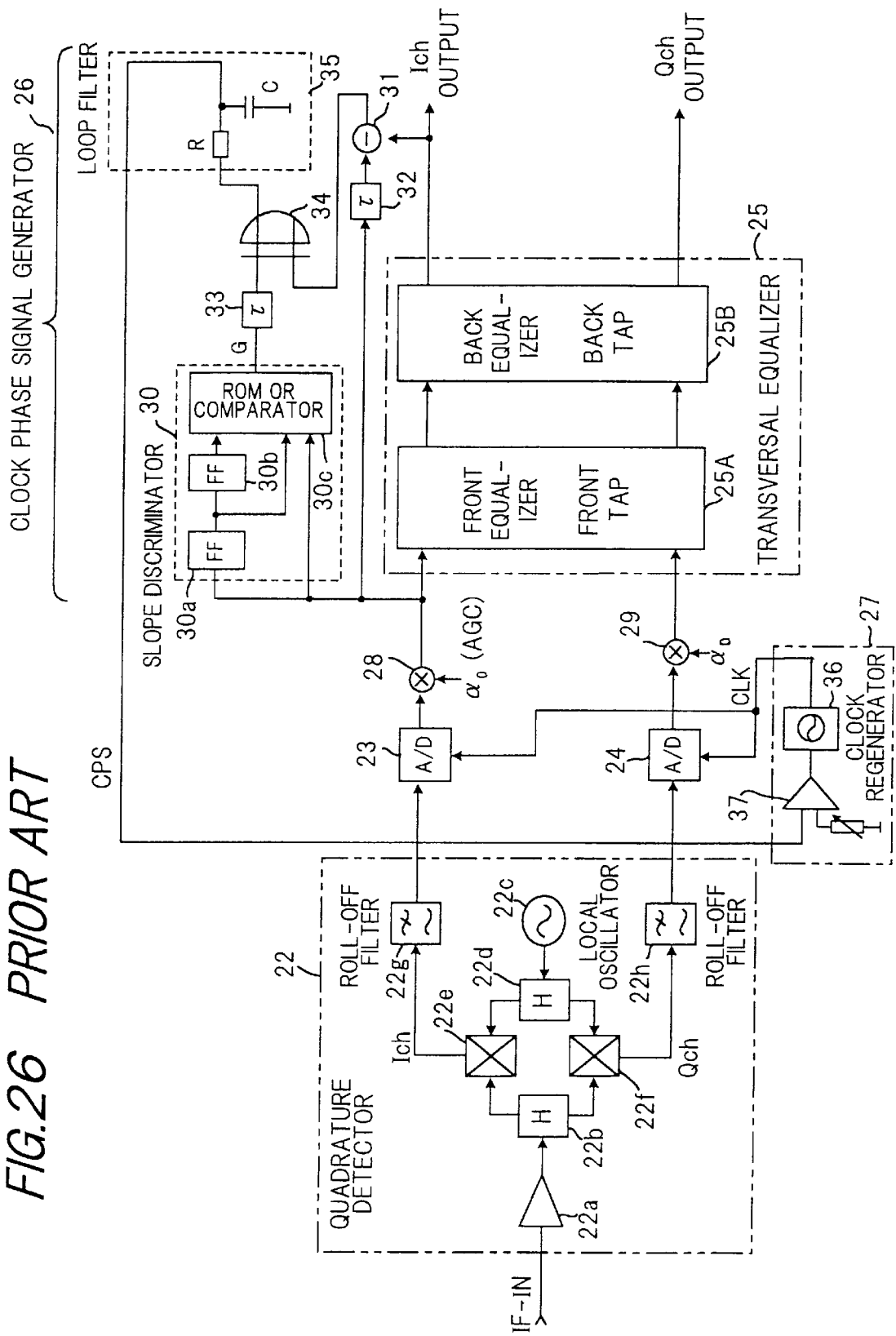
FIG. 26 is a diagram showing an example of the prior art which includes a decision feedback equalizer.

In order to detect the phase shift of the regenerated clock CLK, it is necessary to calculate the error E between the input and output signals of the transversal equalizer 25. If we let TIN and TOUT represent the input and output signals, respectively, of the transversal equalizer 25, then the error E will be represented by the following equation:

$$E = TOUT(t) - TIN(t-\tau) \qquad (1)$$

where $\tau$ is a delay time for achieving time coincidence, namely the time it takes for the input signal TIN to arrive at the center tap of the FIR filter. If we let T represent the period of the symbol data and let n represent the number of delay circuits $Z^{-1}$ preceding the center tap, then $\tau = n \cdot T$ will hold. The interior construction of the transversal equalizer 25 is as shown in FIG. 3. Each FIR filter is constituted by 2n-number of delay circuits $Z^{-1}$, each of which applies a time delay of one symbol clock, (2n+1)-number of multipliers MLP for multiplying the outputs of the delay circuits by predetermined coefficients $\alpha_{-n}$–$\alpha_n$, and an adder ADD for summing the outputs of the multipliers. The values of the coefficients $\alpha_{-n}$–$\alpha_n$ are decided by the method described earlier with reference to FIGS. 22 and 23. The transversal equalizer 25 of FIG. 3 can be modified in the manner shown in FIG. 4, in which case Equation (1) can be written as follows:

$$E = COUT(t) + \alpha_0 \times TIN(t-\tau) - TIN(t-\tau) \quad (2)$$

It should be noted that the error component sought is ascribed to a shift in the clock signal. Since the error stemming from the shift in the clock signal appears on the in-phase side, the component on the quadrature side Qch can be ignored. Further, the coefficient $\alpha_0$ is referred to as the center tap and acts in the same manner as an AGC (automatic gain controller). Since the AGC can be arranged even externally of the transversal equalizer 25, it is brought to the exterior, as illustrated in FIG. 2. If it is assumed that $\alpha_0=1$ holds, then the error E may be written as follows:

$$E = COUT(t) \quad (3)$$

In other words, if the transversal equalizer 25 is constructed as shown in FIG. 4 (where $\alpha_0=1$), then COUT(t) will coincide with the error E between the input and output signals of the transversal equalizer 25. As a result, it is possible to dispense with the subtractor circuit 31 and delay circuit 32 that were necessary in the prior-art radio receiver (see FIG. 19). It is obvious from FIG. 4 that COUT(t) is the output of the FIR filter 25a-1 when $\alpha_0=0$ holds.

With reference again to FIG. 2, the clock phase signal generator 26 includes the slope discriminator 30 for discriminating the slope G of the I-channel signal Ich (G="0" holds when the slope is positive and G="1" when the slope is negative), and the clock phase detector 40 for detecting the clock phase based upon a combination of the sign of the slope G of the I-channel signal and the sign of the error signal E [=COUT(t)], and for outputting the clock phase signal CPS.

The slope discriminator 30 includes the flip-flop circuits 30a, 30b and the ROM 30c, which performs the comparison operation. The flip-flop circuits 30a, 30b (which act as delay units) successively delay the output signal (I-channel signal) of the AD converter 23 by one symbol time period each, and the ROM (which acts as a comparator) 30c compares the outputs of the flip-flop circuits 30a, 30b to detect the slope G of the I-channel signal Ich.

The clock phase detector 40 includes the delay circuit 33 for delaying the slope signal G, which is output by the slope discriminator 30, by the time τ, the EOR circuit 34 for taking the exclusive-OR between the signs of the slope G and error signal E [=COUT(t)], and the loop filter 35, which is constituted by a resistor and capacitor, for smoothing the EOR output signal and outputting the analog phase signal CPS.

The clock regenerating circuit 27 has an oscillator, e.g. the voltage-controlled oscillator (VCO) 36, for outputting a clock signal having a frequency conforming to a phase control signal, and the amplifier 37 for amplifying the phase signal CPS and outputting the phase control signal. The oscillator 36 controls the clock phase by the phase control signal, which conforms to the phase shift of the clock, in such a manner that the phase shift becomes zero. The loop comprising the AD converter 23→clock phase signal generator 26→clock regenerating circuit 27→AD converter 23 constructs a PLL that causes the regenerated clock to coincide with the phase of the symbol clock. If a phase shift develops between the phase of the regenerated clock output from the oscillator 36 and the phase of the symbol clock, the error E is produced between the input and output signals of the transversal equalizer 25. If the error signal E is produced, then the clock phase signal generator 26 uses the slope G of the I-channel signal Ich and the sign of the error signal E to detect the phase difference and generates the phase signal CPS having a value conforming to the this phase difference, and the clock regenerating circuit 27 controls the phase of the regenerated clock by the phase signal CPS and performs control so as to eliminate the phase difference.

By virtue of the foregoing operation, the regenerated clock output by the clock regenerating circuit 27 can be made to coincide at all times with the optimum phase at which the eye pattern opens to the maximum extent, thereby making it possible to improve greatly the accuracy of the AD conversion processing executed by the AD converters 23, 24. Further, in accordance with the arrangement of FIG. 2, a delay circuit and a subtractor circuit can be eliminated, thereby making it possible to simplify the construction of the radio receiving apparatus.

Figure 5:
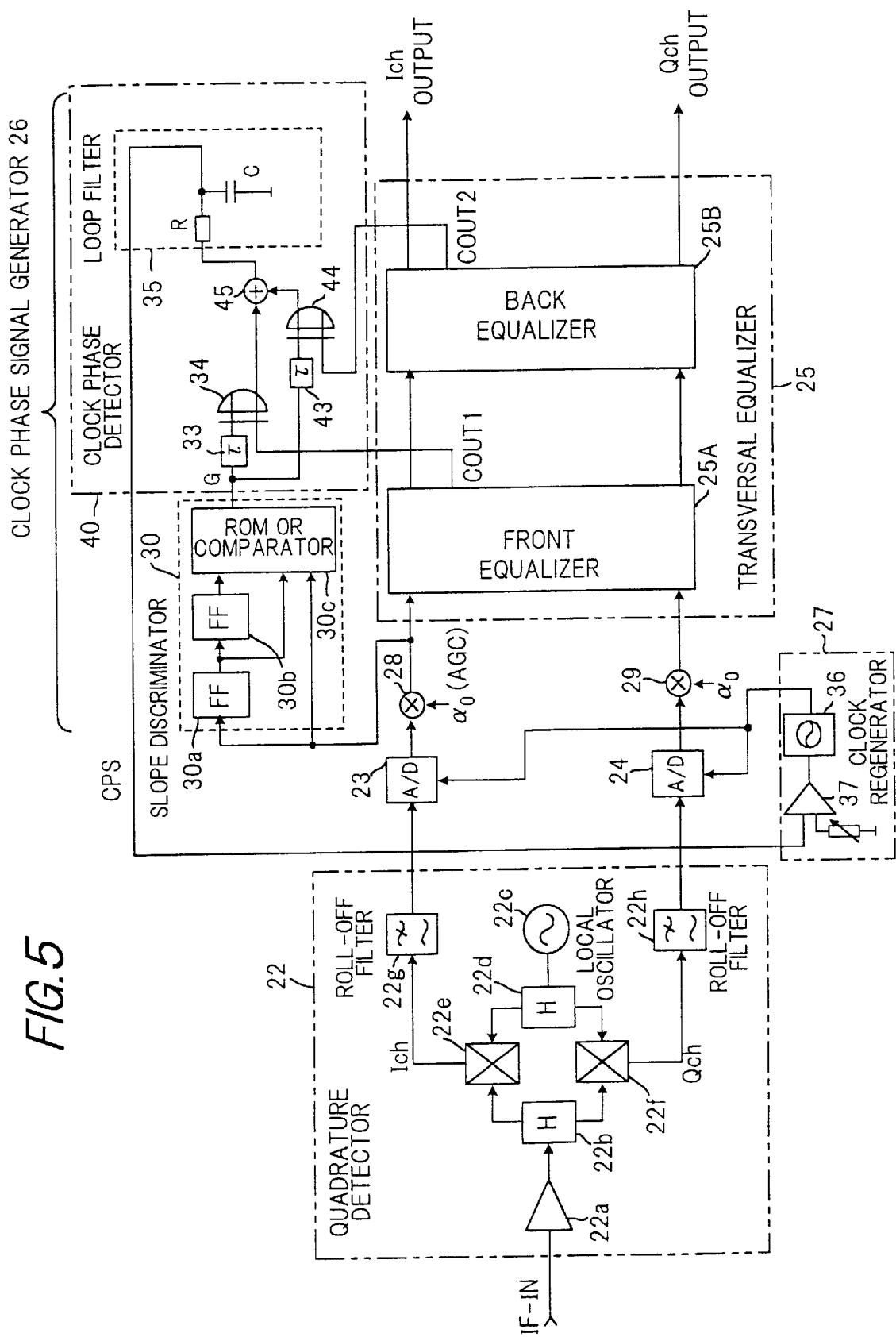
FIG. 5 is a diagram showing the construction of a radio receiving apparatus according to a second embodiment of the present invention.

(C) Second Embodiment (a) When Transversal Equalizer is Simply Separated into Two Halves FIG. 5 is a diagram showing the construction of a radio receiving apparatus according to a second embodiment of the present invention. Components identical with those shown in the first embodiment of FIG. 2 are designated by like reference characters. This embodiment differs from the first embodiment in that each FIR filter constituting the transversal equalizer 25 is separated into two halves about the center tap to construct the front equalizer 25A and back equalizer 25B.

The front equalizer 25A is constituted by a front tap coefficient section obtained when the four FIR filters 25a-1–25a-2, 25b-1–25b-2 of FIG. 3 are separated into two sections about the center tap. The back equalizer 25B is constituted by a back tap coefficient section.

Figure 6:
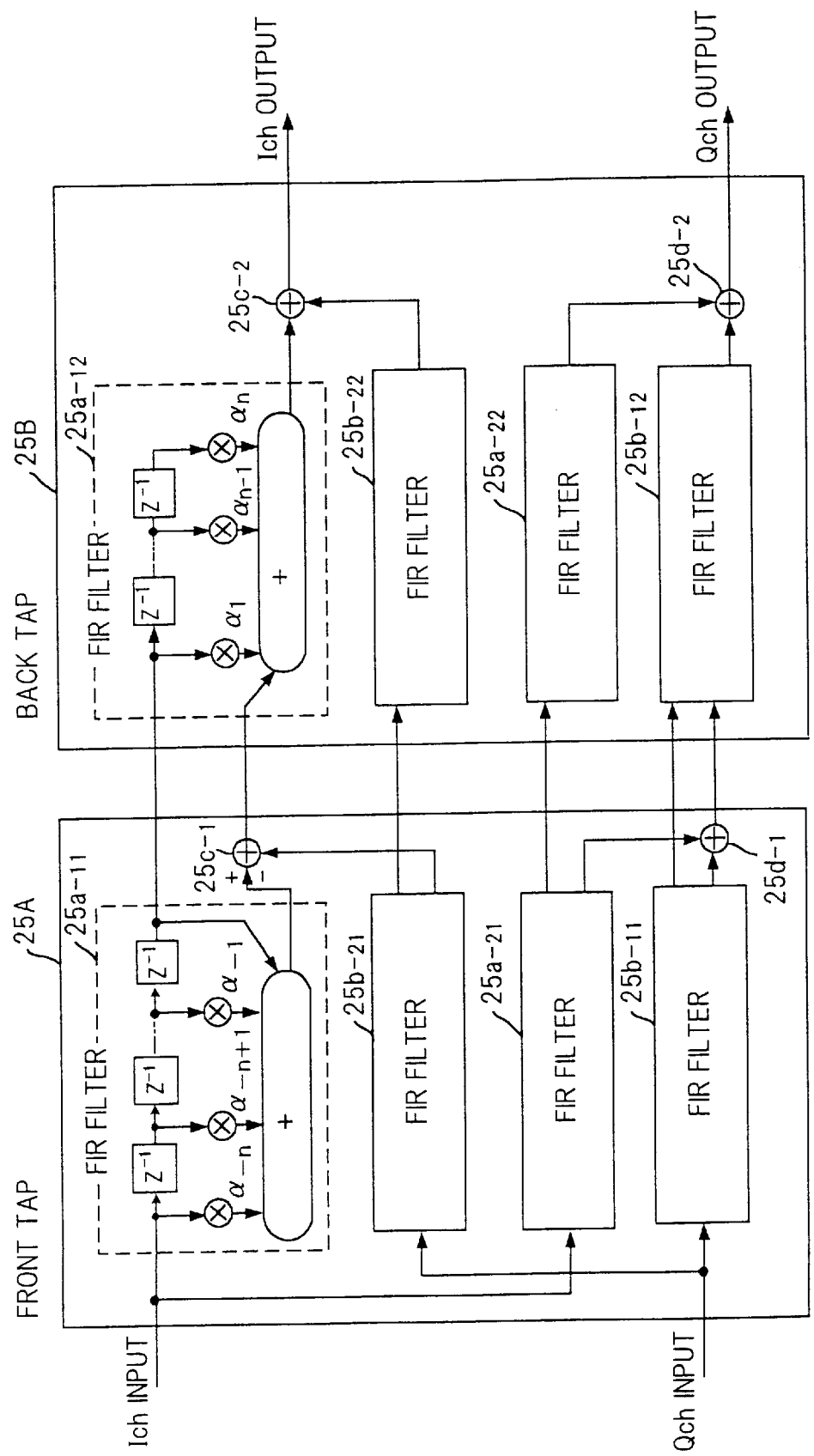
FIG. 6 is a diagram showing the construction of a transversal equalizer in a case where the equalizer has been separated into a front equalizer and a back equalizer.

FIG. 6 is a diagram showing the construction of the transversal equalizer 25 when it has been separated into the front equalizer 25A and back equalizer 25B. The center tap coefficient $\alpha_0$ belongs within the front equalizer 25A. It should be noted that the center tap coefficient $\alpha_0$ of the FIR filter 25a-11 is brought to the exterior of the transversal equalizer as an AGC circuit (see AGCs 28, 29 in FIG. 5), and $\alpha_0=1$ holds. The multiplier, therefore, is eliminated.

The front equalizer 25A has the FIR filters 25a-11–25a-21 of tap coefficients $\alpha_{-n}$–$\alpha_{-1}$, $\alpha_0$ (=1), FIR filters 25b-11–25b-21 of tap coefficients $\beta_{-n}$–$\beta_{-1}$, $\beta_0$, and subtractors 25c-1, 25d-1. Each FIR filter has a forward-type construction. The FIR filters 25a-11–25a-21 of the front equalizer 25A each successively delay the 8-bit 16 QAM data of the entered I channel by the delay units $Z^{-1}$, multiply the output data of the delay units by the tap coefficients $\alpha_{-n}$–$\alpha_{-1}$, $\alpha_0$ ($\alpha_0=1$ in case of the FIR filter 25a-11), sum the products and output the result. The FIR filters 25b-11–25b-21 each successively shift the 8-bit 16 QAM data of the entered Q channel by the delay units $Z^{-1}$, multiply the output data of the delay units by the tap coefficients $\beta_{-n}$–$\beta_{-1}$, $\beta_0$, sum the products and output the result. The subtractor 25c-1 subtracts the Q-channel signal from the I-channel signal to thereby cancel the quadrature component (the Q-channel component) contained in the I-channel signal. The subtractor 25d-1 subtracts the I-channel signal from the Q-channel signal to thereby cancel the quadrature component (the I-channel component) contained in the Q-channel signal.

The back equalizer 25B has the FIR filters 25a-12–25a-22, 25b-12–25b-22 of tap coefficients $\alpha_1$–$\alpha_n$. Each of the FIR filters 25a-12–25a-22, 25b-12–25b-22 has a forward-type construction. The FIR filter 25a-12 of the back equalizer 25B successively shifts the input I-channel signal by the delay units $Z^{-1}$, multiplies the output data of the delay units by the tap coefficients $\alpha_1-\alpha_n$, sums the products and outputs the result. The FIR filter 25a-22 successively shifts the input I-channel signal by the delay units $Z^{-1}$, multiplies the output data of the delay units by the tap coefficients $\alpha_1-\alpha_n$, sums the products and outputs the result.

The FIR filter 25b-12 successively shifts the input Q-channel signal by the delay units $Z^{-1}$, multiplies the output data of the delay units by the tap coefficients $\beta_1-\beta_n$, sums the products and outputs the result. The FIR filter 25b-22 successively shifts the input Q-channel signal by the delay units $Z^{-1}$, multiplies the output data of the delay units by the tap coefficients $\beta_1-\beta_n$, sums the products and outputs the result.

The subtractor 25c-2 subtracts the Q-channel signal from the I-channel signal to thereby cancel the quadrature component (the Q-channel component) contained in the I-channel signal, and the subtractor 25d-2 subtracts the I-channel signal from the Q-channel signal to thereby cancel the quadrature component (the I-channel component) contained in the Q-channel signal.

Figure 7:
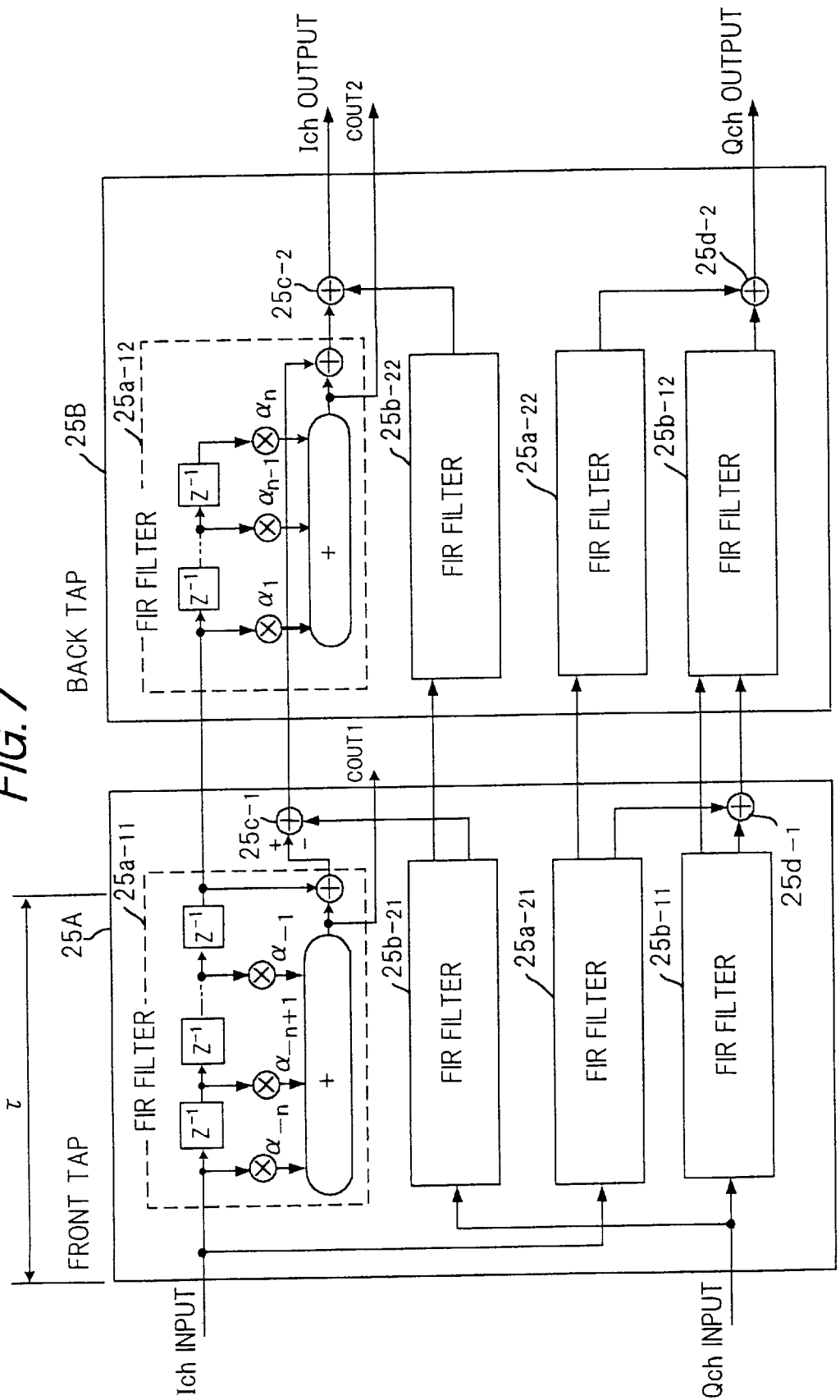
FIG. 7 is a diagram showing the construction of an actual transversal equalizer in a case where the equalizer has been separated into a front equalizer and a back equalizer.

The transversal equalizer 25 shown in FIG. 6 is capable of being modified as shown in FIG. 7. If this arrangement is adopted, the output TOUT(t) of the transversal equalizer 25 will be represented by the following equation:

$$TOUT(t)=COUT1+COUT2+TIN(t-\tau) \tag{4}$$

If Equation (4) is substituted in Equation (1), we have $$E=COUT1(t)+COUT2(t) \tag{5}$$

The error component sought is ascribed to a shift in the clock signal. Since the error stemming from the shift in the clock signal appears on the in-phase side, the component on the quadrature side Qch can be ignored.

The clock phase can be obtained by sequentially accumulating the results of the exclusive-OR operation between the sign of the slope G of the input signal (the I-channel signal) to the front equalizer and the sign of the error signal E. Accordingly, in consideration of the fact that the error signal E is expressed by Equation (5), it can be so arranged that the clock phase detector 40 (1) takes the exclusive-OR between the slope G and the error COUT1, (2) takes the exclusive-OR of the slope G and the error COUT2, (3) adds the results of these exclusive-OR operations and (4) produces the phase signal of the regenerated clock.

The clock phase detector 40 in FIG. 5, which is arranged as set forth above, includes delay circuits 33, 43 each for delaying, by the time $\tau$, the slope signal G output by the slope discriminator 30, the EOR circuit 34 for taking the exclusive-OR between the signs of the slope G and error signal COUT1, an EOR circuit 44 for taking the exclusive-OR between the signs of the slope G and error signal COUT2, an adder 45 for adding the outputs of the EOR circuits and outputting the combined signal, and the loop filter 35, which is constituted by a resistor and capacitor, for smoothing the combined output of the adder 45 and outputting the analog clock phase signal CPS.

As set forth above, the transversal equalizer 25 is separated into a front equalizer and a back equalizer and the clock phase signal is generated based upon the front and back errors. This makes it possible to improve the accuracy of the regenerated clock. Further, as in the first embodiment, delay and subtractor circuits can be eliminated to simplify the radio receiving apparatus.

(b) Example Using Decision Feedback Equalizer

A decision feedback equalizer can be used instead of the transversal equalizer 25 of the second embodiment shown in FIG. 2.

Figure 8:
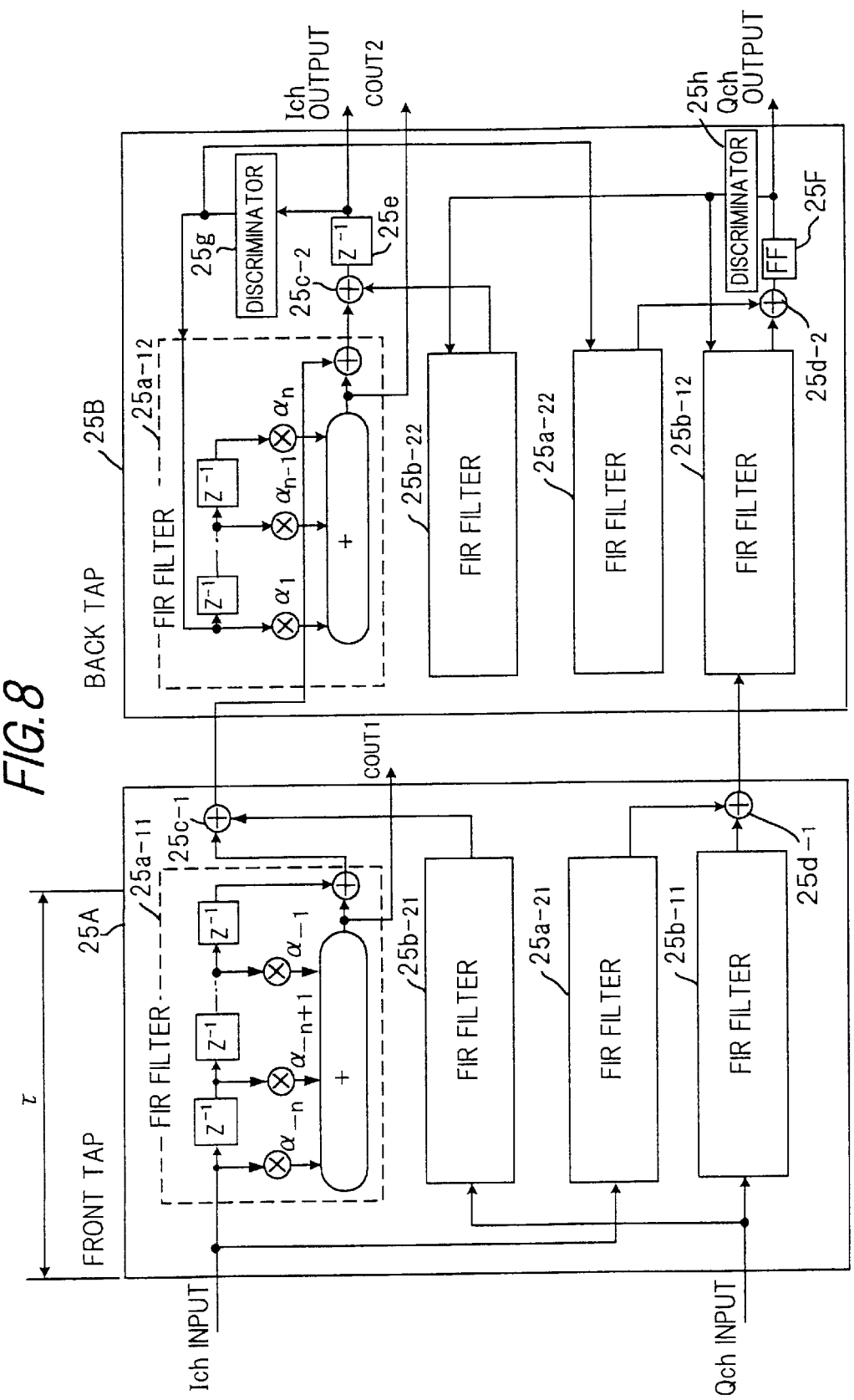
FIG. 8 is a diagram showing the construction of a decision feedback transversal equalizer according to the present invention.
Figure 27:
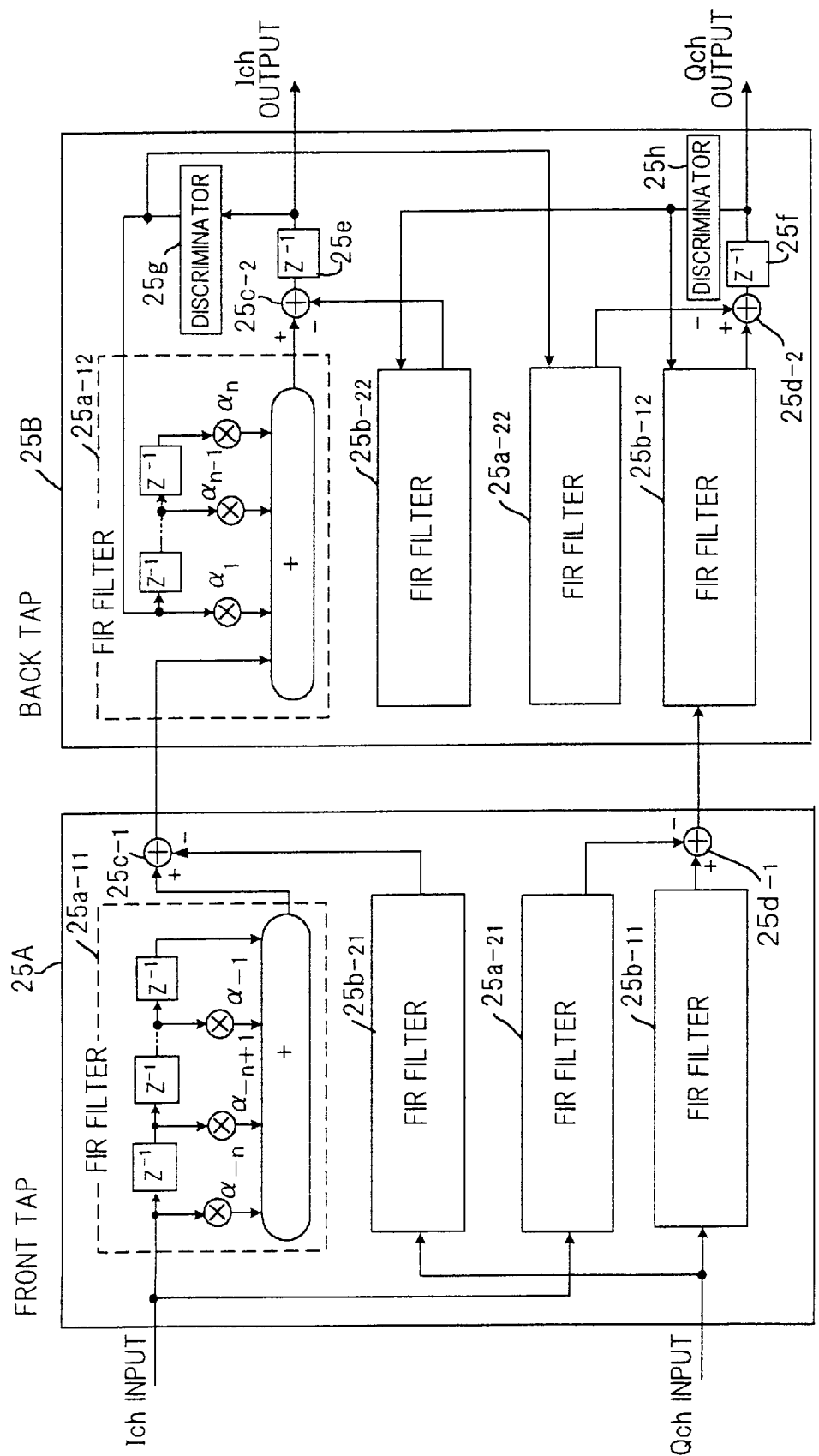
FIG. 27 is a diagram showing an example of the construction of a front tap and back tap according to the prior art.

FIG. 8 is a diagram showing the construction of the decision feedback equalizer in which the internal connections of the FIR filters 25a-11, 25a-12 constructing the decision feedback equalizer of FIG. 27 are somewhat modified. The output TOUT(t) of this decision feedback equalizer is the same as that transversal equalizer of FIG. 7, i.e., $$TOUT(t)=COUT1+COUT2+TIN(t) \tag{4}$$

and the error E between the input and output signals of the decision feedback equalizer is given by the following:

$$E=COUT1(t)+COUT2(t) \tag{5}$$

Accordingly, the decision feedback equalizer of FIG. 8 can be substituted for the transversal equalizer 25 of FIG. 5. Owing to use of the decision feedback equalizer, data from which noise and interference components contained in the digital data after the equalization thereof have been removed is fed back. As a result, the tap coefficients can be made to converge to correct values and the performance of the equalizer can be improved. In addition, since the clock phase signal is generated based upon the front and back errors, as in the transversal equalizer, the accuracy of the regenerated clock can be improved.

(D) Third Embodiment

Figure 9:
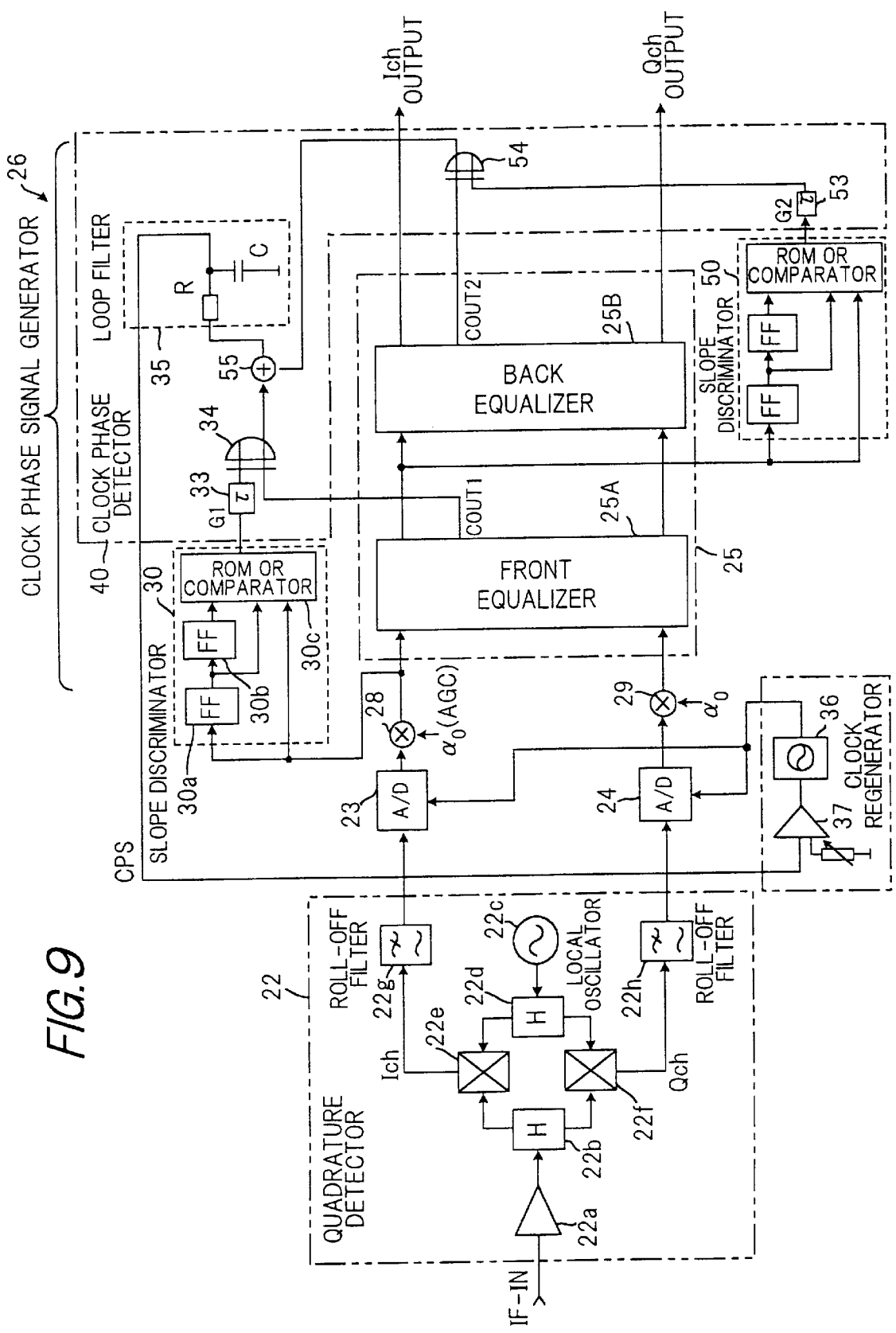
FIG. 9 is a diagram showing the construction of a radio receiving apparatus according to a third embodiment of the present invention.

FIG. 9 is a diagram showing the construction of the radio receiving apparatus according to a third embodiment of the present invention. Components identical with those shown in the second embodiment of FIG. 5 are designated by like reference characters. This embodiment differs from the second embodiment in that separate slope discriminators are provided for respective ones of the front and back equalizers. The phase signal CPS is produced by summing the results of exclusive-OR operations between the signs of slopes G1, G2 (positive="0", negative="1"), which have been discriminated by the respective slope discriminators, and the signs of the errors COUT1, COUT2 given by Equation (5).

The arrangement of FIG. 9 includes a second slope discriminator 50 for obtaining the slope G2 of the input signal to the back equalizer 25B. This slope discriminator has a construction exactly the same as that of the first slope discriminator 30, which obtains the slope G1 of the input signal (the I-channel signal Ich) to the front equalizer 25A. The clock phase detector 40 has delay circuits 33, 53 for delaying, by the time t, the slope signals G1, G2 output by the first and second slope discriminators 30, 50, respectively, the EOR circuit 34 for taking the exclusive-OR between the sign of the slope G1 of the input signal to the front equalizer and the sign of the error signal COUT1, and EOR circuit 54 for taking the exclusive-OR between the sign of the slope G2 of the input signal to the back equalizer and the sign of the error signal C0UT2, an adder 55 for adding the outputs of the EOR circuits and outputting the combined signal, and the loop filter 35, which is constituted by a resistor and capacitor, for smoothing the combined output of the adder 55 and outputting the analog clock phase signal CPS.

The clock phase detector 40 takes the exclusive-OR between the slope G1 and the error COUT1, takes the exclusive-OR between the slope G2 and the error COUT2, adds the results of these two exclusive-OR operations, produces the phase signal CPS of the regenerated clock based upon the sum and outputs the signal CPS.

If the phase discriminators are separately arranged for the front and back equalizers as in the third embodiment, the number of slope discriminators is increased by one but it possible to obtain correct signal slopes conforming to the front and back equalizers and the accuracy of the regenerated clock can be improved.

(E) Fourth Embodiment (a) Principles

When deep phasing occurs, the tap coefficients of the FIR filters constructing the transversal equalizer take on large values and the values of the errors COUT1, COUT2 increase. When this occurs, the error due do the phase shift of the clock becomes imbedded and the accuracy of the regenerated clock phase declines. In general, multipath phasing includes a minimum phase (MP), in which the interference wave lags behind the main wave, and a non-minimum phase (NMP), in which the main wave lags behind the interference wave. The tap coefficients $\alpha_1$–$\alpha_n$ of the back equalizer 25B of the transversal equalizer primarily indicate large values in case of the minimum phase MP. In the case of the non-minimum phase NMP, the coefficients $\alpha_{-1}$–$\alpha_{-n}$ of the transversal equalizer 25A mainly take on large values.

Figure 10A:
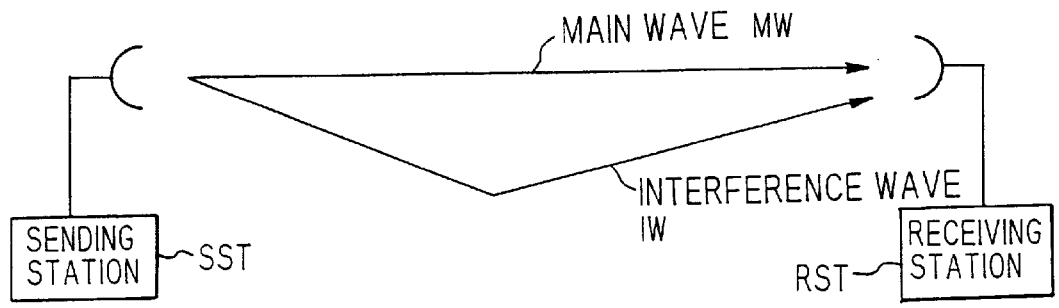
FIGS. 10A–10C are diagrams useful in describing coefficients in minimum and non-minimum phases.
Figure 10B:
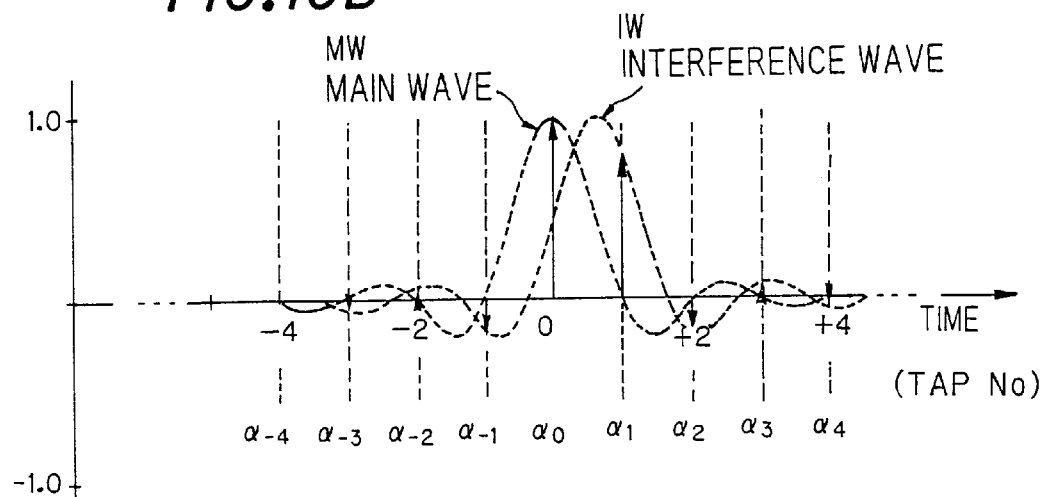
Figure 10C:
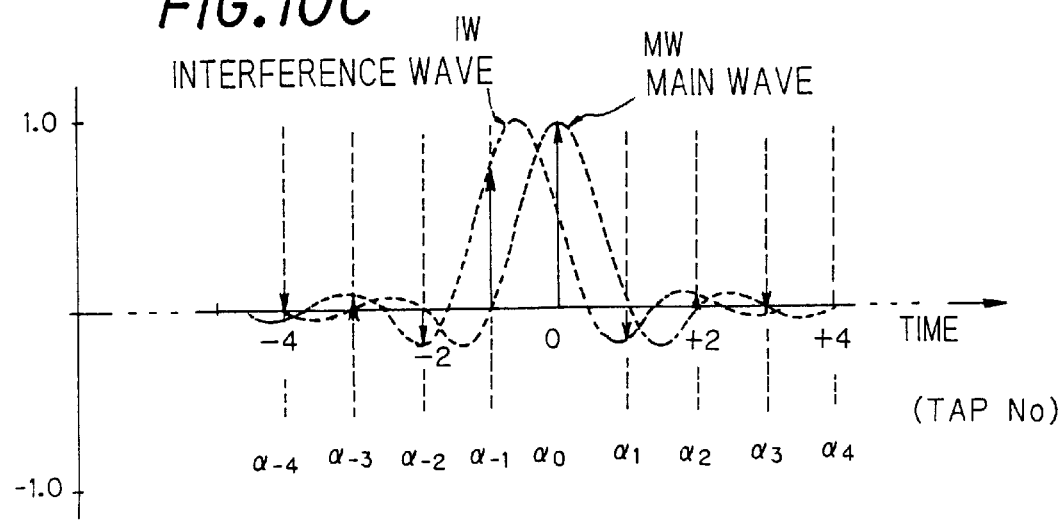

FIGS. 10A–10C are diagrams useful in describing tap coefficients in the minimum and non-minimum phases, in which FIG. 10A shows the relationship between a main wave MW and an interference wave IW, FIG. 10B shows the impulse responses of the main and interference waves in the case of the minimum phase (MP), and FIG. 10C shows the impulse responses of the main and interference waves in the case of the non-minimum phase (NMP)

When a sending station SST is making a radio transmission to a receiving station RST, a wave obtained by combining the main wave MW and interference wave IW becomes the received wave. The minimum phase is in effect if the interference wave IW lags behind the main wave MW and the non-minimum phase if the interference wave IW leads the main wave MW.

The impulse responses of the main wave MW and interference wave IW in the case of the minimum phase (MP) are each as shown in FIG. 10B. Here the tap coefficients on the + side (the back tap coefficients) $\alpha_1$–$\alpha_n$ become larger than the tap coefficients on the – side (the front tap coefficients) $\alpha_{-1}$–$\alpha_{-n}$. That is, in the case of the minimum phase, the tap coefficients of the back equalizer 25B of the transversal equalizer become larger.

Conversely, in the case of the non-minimum phase (NMP), the tap coefficients $\alpha_{-1}$–$\alpha_{-n}$ on the – side become larger than the tap coefficients $\alpha_1$–$\alpha_n$ on the + side. That is, in the case of the non-minimum phase, the tap coefficients of the front equalizer 25A of the transversal equalizer become larger.

If use is made of the error signal for which the tap coefficients are smaller when phasing occurs, a decline in the accuracy of clock regeneration can be suppressed. Accordingly, in the fourth embodiment, the particular phase of phasing is identified and phase control is performed, based upon the identified phase, using the error signal of the equalizer for which the tap coefficient values are smaller, whereby the decline in the accuracy of clock regeneration is suppressed. This makes it possible to withstand deep phasing.

(b) Construction

Figure 11:
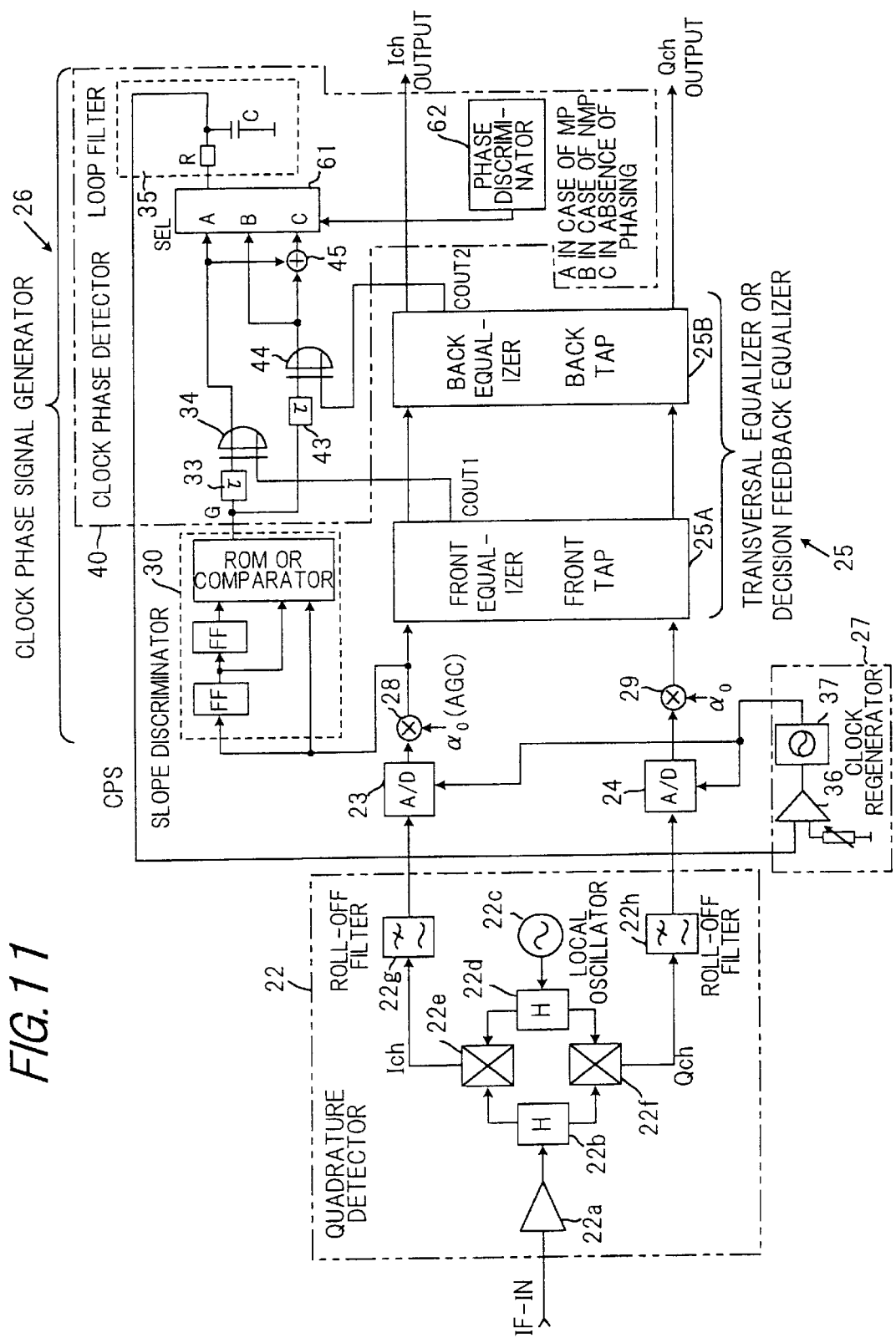
FIG. 11 is a diagram showing the construction of a radio receiving apparatus according to a fourth embodiment capable of dealing with phasing.

FIG. 11 is a diagram showing the construction of the radio receiving apparatus according to a fourth embodiment of the present invention. Components identical with those shown in the second embodiment of FIG. 5 are designated by like reference characters. This embodiment differs from the second embodiment in that the EOR output signal used in producing the clock phase signal is changed over based upon whether phasing has occurred or not and the phasing state.

As shown in FIG. 11, a selector 61 his a 3-input, 1-output construction for selecting and outputting a predetermined input based upon whether phasing has occurred or not as well as the phase (MP, NMP) if phasing has occurred. The result of the exclusive-OR operation between the slope G and error COUT1 enters an A terminal of the selector 61, the result of the exclusive-OR operation between the slope G and error COUT2 enters a B terminal of the selector 61, and the sum obtained by adding the results of the exclusive-OR operations enters a C terminal of the selector 61. A phase discriminator 62 determines whether phasing has occurred or not as well as the phase (MP, NMP) if phasing has occurred.

The selector 61 (1) outputs the sum obtained by adding the logical outputs of the EOR circuits 34, 44, in a manner similar to that of the second embodiment of FIG. 5, if phasing has not occurred; (2) outputs the result (the logical output of the EOR circuit 34) of the exclusive-OR between the slope G and error COUT1, which result has entered the A terminal, in case of the minimum phase (MP), and (3) outputs the result (the logical output of the EOR circuit 44) of the exclusive-OR between the slope G and error COUT2, which result has entered the B terminal, in case of the non-minimum phase (NMP). As a result, the loop filter 35 smoothes the output signal of the selector 61 and generates the clock phase signal CPS.

Thus, in accordance with the fourth embodiment, even if phasing has occurred, the phase (MP or NMP) is identified and phase control is performed, based upon the phase identified, using the error signal for which the tap coefficient values are smaller. This makes it possible to suppress a decline in the accuracy of regenerated clock and to withstand deep phasing.

It should be noted that an arrangement can be adopted in which the third embodiment of FIG. 9 is provided with the selector 61 and phase discriminator 62 and the EOR output used in producing the phase signal is switched over based upon whether phasing has occurred or not as well as the phasing state.

(c) Phase Discriminator (c-1) First Phase Discriminator

The tap coefficients of the transversal equalizer can be utilized to determine whether the prevailing phase is the minimum phase (MP) or non-minimum phase (NMP). As already described, the tap coefficients of the back equalizer 25B take on large values in case of the minimum phase (MP) and the tap coefficients of the front equalizer 25A take on large values in case of the non-minimum phase (NMP). This is utilized to compare the total value A of absolute values of one or more tap coefficients in the front equalizer 25A and the total value B of absolute values of one or more tap coefficients in the back equalizer 25B, thereby discriminating whether the prevailing state is the minimum phase (MP) or the non-minimum phase (NMP).

Figure 12:
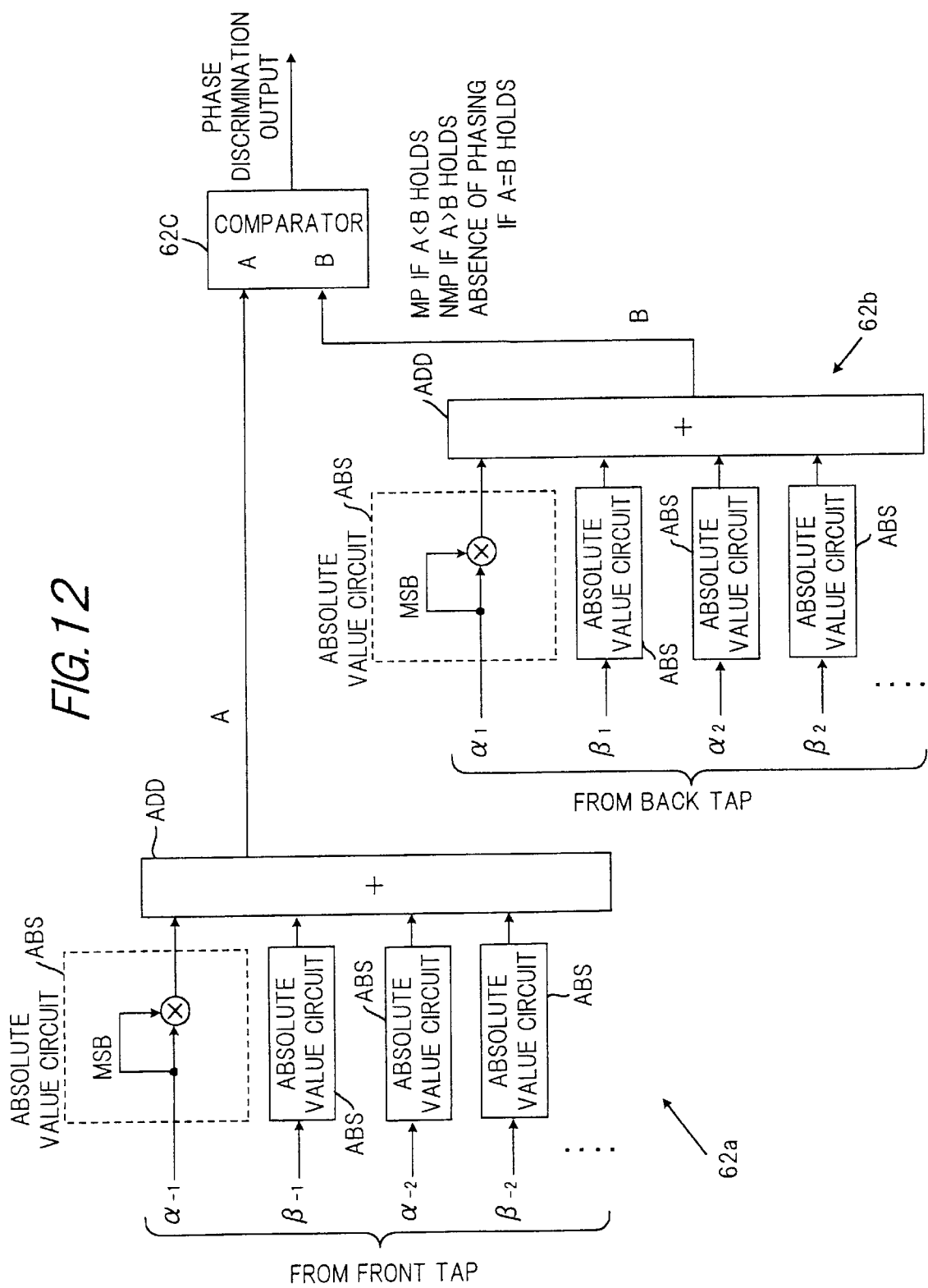
FIG. 12 is a diagram showing the construction of a phase discriminator.

FIG. 12 is a diagram showing the construction of the phase discriminator 62 which discriminates the phase in accordance with the principles set forth above. The phase discriminator 62 includes an arithmetic circuit 62a for obtaining the absolute values of the tap coefficients $\alpha_{-1}$–$\alpha_{-n}$, $\beta_{-1}$–$\beta_{-n}$ of the front equalizer 25A and output the total value A of these absolute values, an arithmetic circuit 62b for obtaining the absolute values of the tap coefficients $\alpha_1$–$\alpha_n$, $\beta_1$–$\beta_n$ of the back equalizer 25B and output the total value B of these absolute values, and a comparator 62c for comparing the magnitudes of the total values A and B. Each of the arithmetic circuits 62a, 62b has absolute value circuits ABS for multiplying the tap coefficients by the signs (most significant bit MSB) thereof and outputting the absolute value, and an adder ADD for summing the outputs of the absolute value circuits.

The comparator 62c compares the magnitudes of the total values A, B and (1) determines that the phase is the minimum phase (MP) when A<B holds and the difference between A and B is greater than a set value, (2) determines that the phase is the non-minimum phase (NMP) when A>B holds and the difference between A and B is greater than a set value, and (3) determines that phasing has not occurred if A and B are approximately equal. The comparator 62c inputs the result of this determination to the selector 61.

Though the coefficients $\beta_i$ on the quadrature side are taken into account in the foregoing description, phasing can be discriminated using only the coefficients on the in-phase side. Further, the method of obtaining the absolute values is only one example and does not impose a limitation upon the invention.

(c-2) Second Phase Discriminator

Since the first tap coefficient $\alpha_1$ of the back equalizer 25B becomes larger if the prevailing phase is the minimum phase (MP), the effect of this is that the second tap coefficient $\alpha_2$ also takes on the same sign. Since the first tap coefficient $\alpha_{-1}$ of the front equalizer 25A becomes larger if the prevailing phase is the non-minimum phase (NMP), the effect is that the second tap coefficient $\alpha_{-2}$ also takes on the same sign. Though the signs of the tap coefficients $\alpha_1, \alpha_2; \alpha_{-1}, \alpha_{-2}$ in FIGS. 10B, 10C appear to be different, the second tap coefficient value is small. Since the first tap coefficients $\alpha_1, \alpha_{-1}$ become larger in actual control, the equivalent residuals thereof influence the second tap coefficients $\alpha_2, \alpha_{-2}$ so that these actually become larger than the values indicated in FIGS. 10B, 10C and they take on the same sign.

Accordingly, whether or not phasing has occurred and, if it has, whether the phase is the minimum phase (MP) or the non-minimum phase (NMP) can be determined by discriminating whether the signs of the first and second tap coefficients in the front equalizer 25A are the same or whether the signs of the first and second tap coefficients in the back equalizer 25B are the same.

Figure 13:
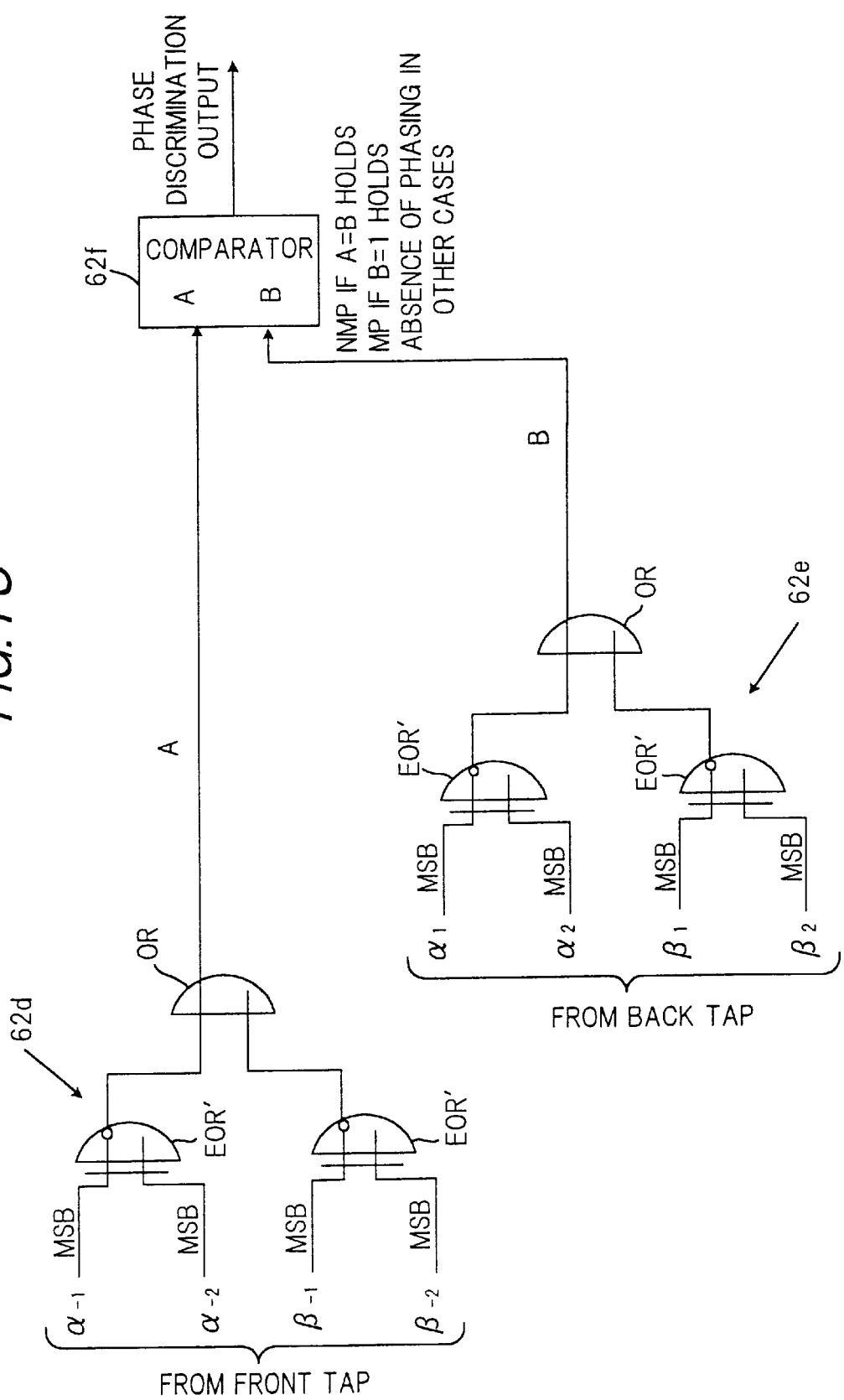
FIG. 13 is a diagram showing the construction of another phase discriminator.

FIG. 13 is a diagram showing the construction of the phase discriminator which performs phase discrimination in accordance with the principles described above. The phase discriminator includes a first sign coincidence arithmetic circuit 62d which checks to see whether the signs (most significant bits MSB) of the first and second tap coefficients $\alpha_{-1}, \alpha_{-2}$ on the I-channel side in the front equalizer 25A coincide and whether the signs of the first and second tap coefficients $\beta_{-1}, \beta_{-2}$ on the Q-channel side coincide, and outputs "1" when the signs on one of these two sides coincide and "0" when the signs on neither side coincide. The phase discriminator further includes a second sign coincidence arithmetic circuit 62e which checks to see whether the signs of the first and second tap coefficients $\alpha_1, \alpha_2$ on the I-channel side in the back equalizer 25B coincide and whether the signs of the first and second tap coefficients $\beta_1, \beta_2$ on the Q-channel side coincide, and outputs "1" when the signs on one of these two sides coincide and "0" when the signs on neither side coincide. A comparator 62f determines whether or not phasing has occurred and, if it has, whether the phase is the minimum phase (MP) or non-minimum phase (NMP), based upon the outputs A, B of the first and second sign coincidence arithmetic circuits 62d, 62e. Each of these arithmetic circuits 62d, 62e includes a logic circuit EOR for outputting the negative of the result of the exclusive-OR operation, and an OR gate OR.

The comparator 62f compares the arithmetic circuit outputs A and B and (1) determines that the phase is the minimum phase (MP) if A=0, B=1 hold, (2) determines that the phase is the non-minimum phase (NMP) if A=1, B=0 hold, and (3) determines that phasing has not occurred if A and B indicates states other than those mentioned. The comparator 62f outputs the result of the determination to the selector 61.

Though both $\alpha$ and $\beta$ are used in FIG. 13, it is possible to perform the above-described operation simply by using $\alpha$ alone.

(F) Fifth Embodiment

Figure 14:
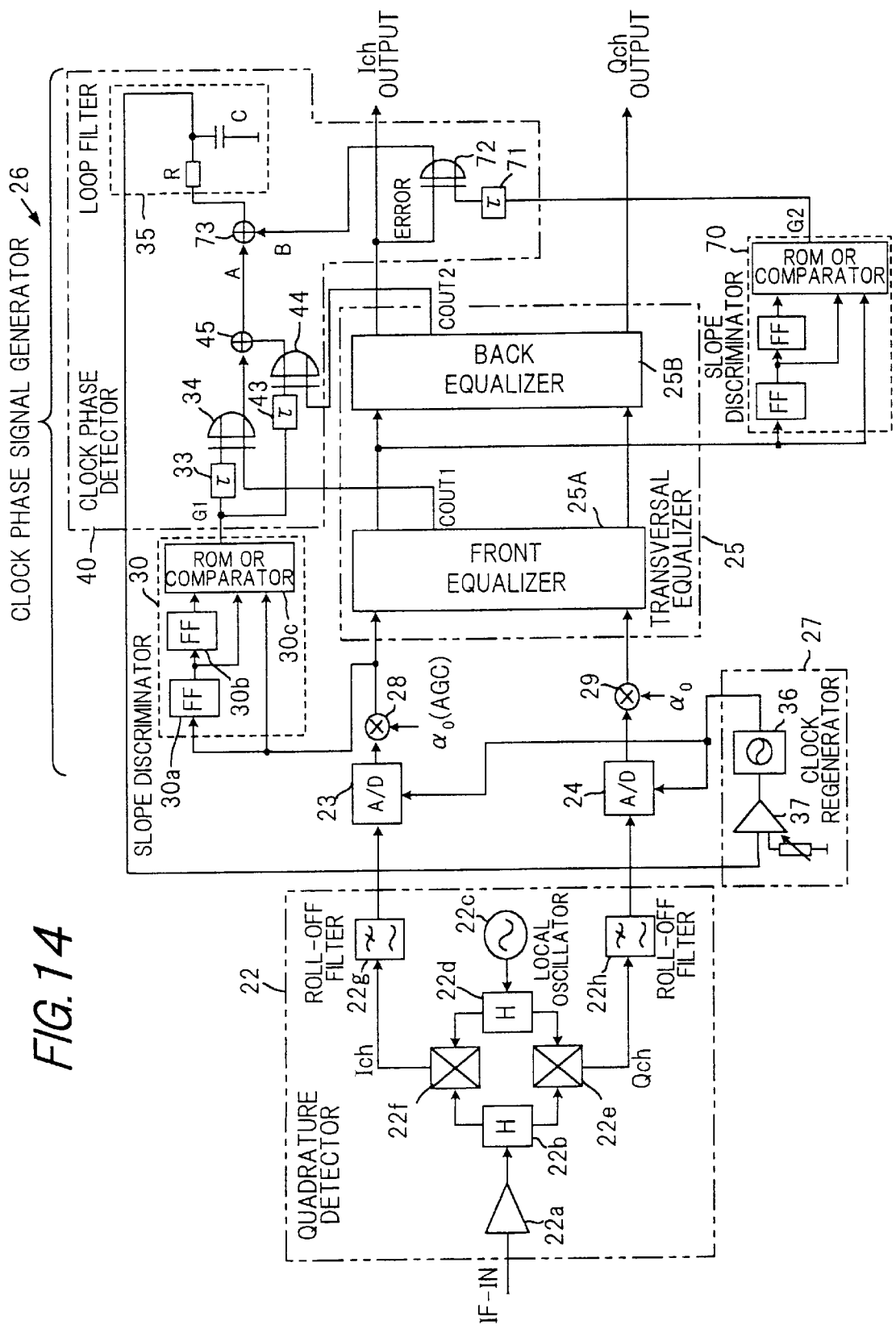
FIG. 14 is a diagram showing the construction of a radio receiving apparatus according to a fifth embodiment of the present invention.

FIG. 14 is a diagram showing the construction of the radio receiving apparatus according to a fifth embodiment of the present invention. Components identical with those shown in the second embodiment of FIG. 5 are designated by like reference characters. This embodiment differs from the second embodiment in that (1) there is provided a slope discriminator for obtaining the slope G2 of the signal (the input signal of the back equalizer 25B) output from the front equalizer 25A, and (2) the final error E of the I-channel signal output by the back equalizer 25B and the slope G2 of the input signal of the back equalizer 25B are multiplied together and the product is used to perform phase control.

The apparatus shown in FIG. 14 includes a slope discriminator 70 for obtaining the slope G2 of the output signal from the front equalizer 25A (the input signal to the back equalizer 25B). The slope discriminator 70 has a construction exactly the same as that of the first slope discriminator 30 which obtains the slope G1 of the input signal (the I-channel signal) of the front equalizer. The clock phase detector 40 in FIG. 14 includes a delay circuit 71 for delaying, by the time t, the slope signal G2 output by the slope discriminator 70, an EOR circuit 72 for taking the exclusive-OR between the error E of the I-channel signal output by the back equalizer 25B and the slope G2 of the input signal to the back equalizer 25B and outputting the result of the exclusive-OR operation, and an adder 73 for adding the logical results of the EOR circuits 34, 44, 72 and inputting the result to the loop filter 35.

Figure 15A:
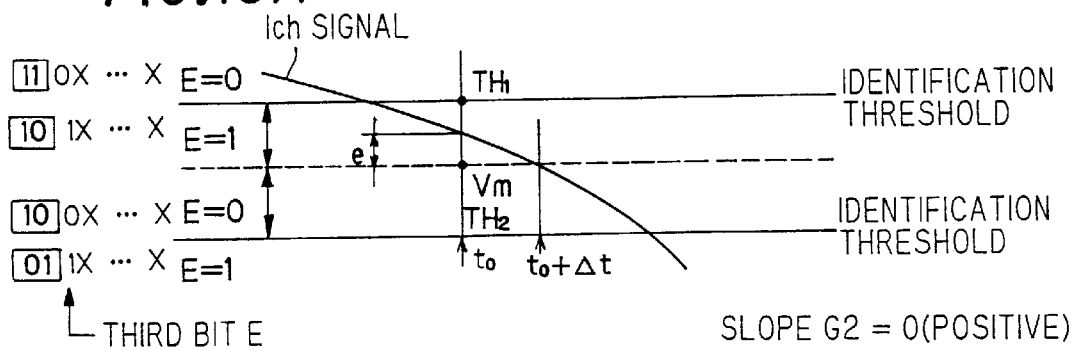
FIGS. 15A–15C are diagrams useful in describing phase calculation processing.

If the I- and Q-channel signals are each represented by eight bits in 16 QAM, the two high-order bits represent data and the six low-order bits represent the error due to waveform distortion. The relationship between the identification thresholds of the two high-order bits and the digital data is as shown in FIG. 15A. If the third bit (error bit) E of the digital data is "1", then the I-channel signal is greater than an intermediate value (ideal value) Vm midway between identification threshold values $TH_1, TH_2$. If E="0" holds, then the I-channel signal is less than the intermediate value Vm. A deviation e of the I-channel signal from the intermediate value Vm at the timing to of the regenerated clock occurs owing to a phase shift $\Delta t$ from the ideal clock (symbol clock). Accordingly, it will suffice to control the phase by $\Delta t$ so that the deviation e will become zero.

A. Phase Shift Direction=Delay Direction="1"

Figure 15B:
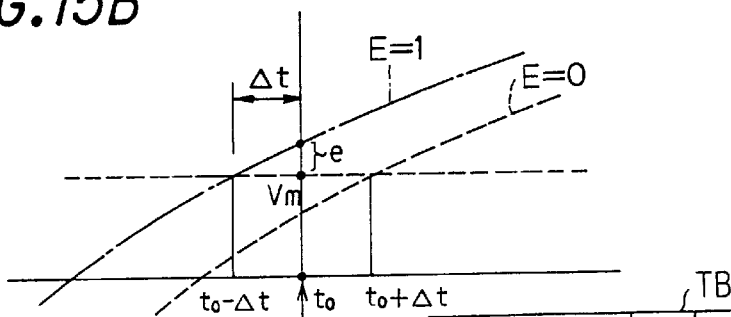

If the I-channel signal obtained from the back equalizer 25B is assumed to be as indicated by the dashed line in FIG. 15B (error bit E="1"), the phase shift will be $\Delta t$ and the phase of the regenerated clock will lead the symbol clock by $\Delta t$. Accordingly, is it necessary to perform control in such a direction that the phase of the regenerated clock will be delayed. That is, if the slope G2 of the I-channel signal is positive (G2=0) and the error bit E is "1", this means that the phase of the I-channel signal is leading and it is necessary to perform control so as to delay the phase of the I-channel signal.

B. Phase Shift Direction=Advance Direction="0"

If the I-channel signal obtained from the back equalizer 25B is assumed to be as indicated by the dashed line in FIG. 15B (error bit E="0"), the phase shift will be $\Delta t$ and the phase of the regenerated clock will lag the symbol clock by $\Delta t$. Accordingly, it is necessary to perform control in such a direction that the phase of the regenerated clock will be advanced. That is, if the slope G2 of the I-channel signal is positive (G2=0) and the error bit E is "0", this means that the phase of the I-channel signal is lagging and it is necessary to perform control so as to advance the phase of the I-channel signal.

Figure 15C:
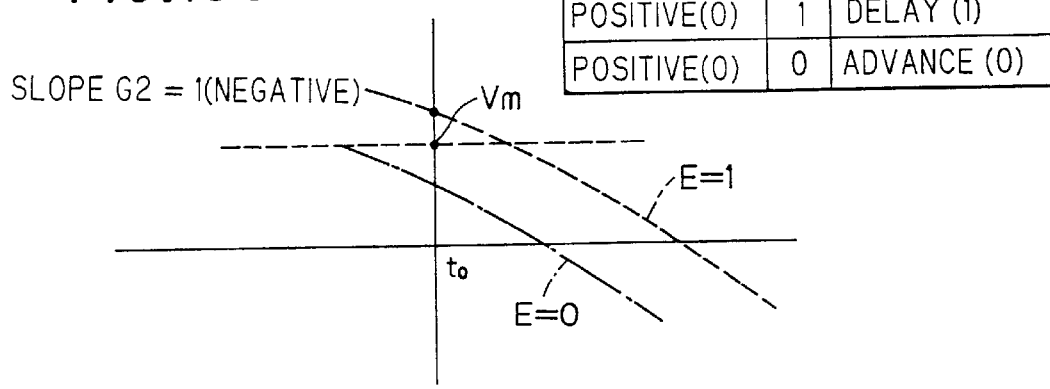

Combining A and B results in the table TB shown in FIG. 15B. The foregoing is for a case where the slope G2 of the I-channel signal is positive. If the slope G2 is negative (G2="1"), the result is the table shown in FIG. 15C.

Thus, if a positive slope is expressed by "0", a negative slope is expressed by "1", an advance phase shift is "0" and a delay phase shift is "1", then the exclusive-OR of the slope G2 and error bit E is taken and control is performed so as to advance the phase if the result of the ex-OR operation is "0" and delay the phase if the result of the ex-OR operation is "1".

Accordingly, the slope discriminator 70 obtains the slope G2 of the I-channel signal that is input to the back equalizer 25B, the EOR circuit 72 takes the exclusive-OR of the slope G2 and error bit E of the I-channel signal output by the back equalizer 25B and outputs the result of the exclusive-OR operation, and the adder 73 adds the logical results from the EOR circuits 34, 44, 72 and inputs the sum to the loop filter 35. The latter smoothes the value of the sum from the adder 73 and generates the clock phase signal CPS, and the clock regenerating circuit 27 controls the phase of the regenerated clock, based upon the phase signal CPS, in such a manner that he phase shift $\Delta t$ becomes zero. It should be noted that an arrangement can be adopted in which the output A of the adder 45 and the output B of the EOR circuit 72 are suitably weighted and then summed by the adder 73, which outputs the sum.

In accordance with the fifth embodiment, the final error E of the I-channel signal and the slope G2 of the I-channel signal input to the back equalizer 25B are multiplied together and the product is used to perform phase control. As a result, the phase accuracy of the regenerated clock can be improved and so can the ability to withstand deep phasing.

(G) If the phase of the regenerated clock CLK shifts from the ideal point, the tap coefficients change. This change in tap coefficient value is expressed by $(-\alpha_1+\alpha_{-1})$. Accordingly, in a sixth embodiment, the phase accuracy of the regenerated clock is improved by performing phase control using this component.

Figure 16A:
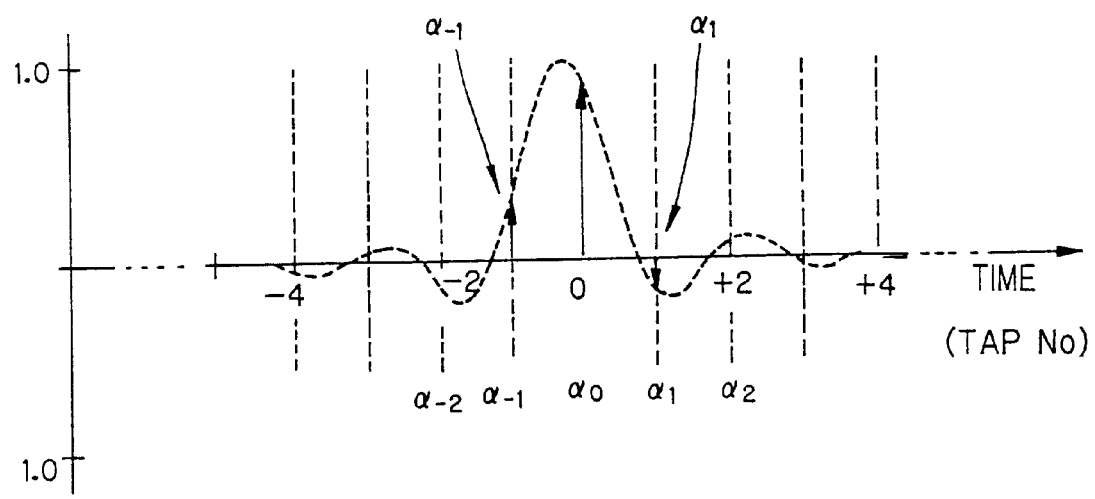
FIGS. 16A, 16B are diagrams useful in describing the relationship between clock phase shift and $(-\alpha_1+\alpha_{-1})$.
Figure 16B:
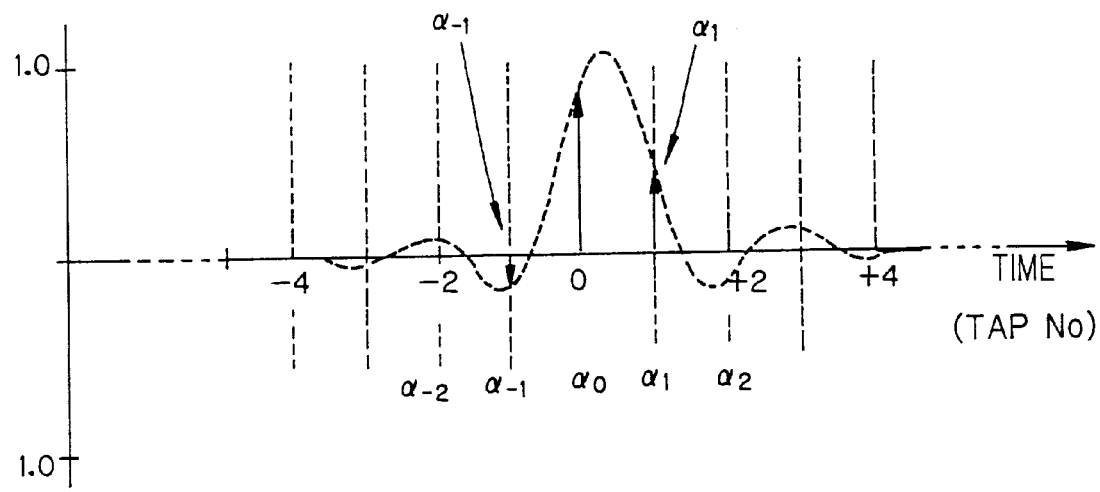

FIGS. 16A, 16B are diagrams useful in describing the reason for expressing the clock phase shift by $(-\alpha_1+\alpha_{-1})$. In a case where the clock phase is leading, the impulse response becomes as shown in FIG. 16A and the following inequality holds in regard to the tap coefficients $\alpha_1$, $\alpha_{-1}$ of the transversal equalizer 25:

$$-\alpha_1+\alpha_{-1}>0$$

In a case where the clock phase is lagging, the impulse response becomes as shown in FIG. 16B and the following inequality holds in regard to the tap coefficients $\alpha_1$, $\alpha_{-1}$ of the transversal equalizer 25:

$$-\alpha_1+\alpha_{-1}<0$$

Accordingly, the sign of $-\alpha_1+\alpha_{-1}$ changes in dependence upon whether the clock phase is leading or lagging, and the value of $-\alpha_1+\alpha_{-1}$ changes in dependence upon the amount of lead or lag. In other words, $-\alpha_1+\alpha_{-1}$ indicates the phase shift of the regenerated clock CLK.

Figure 17:
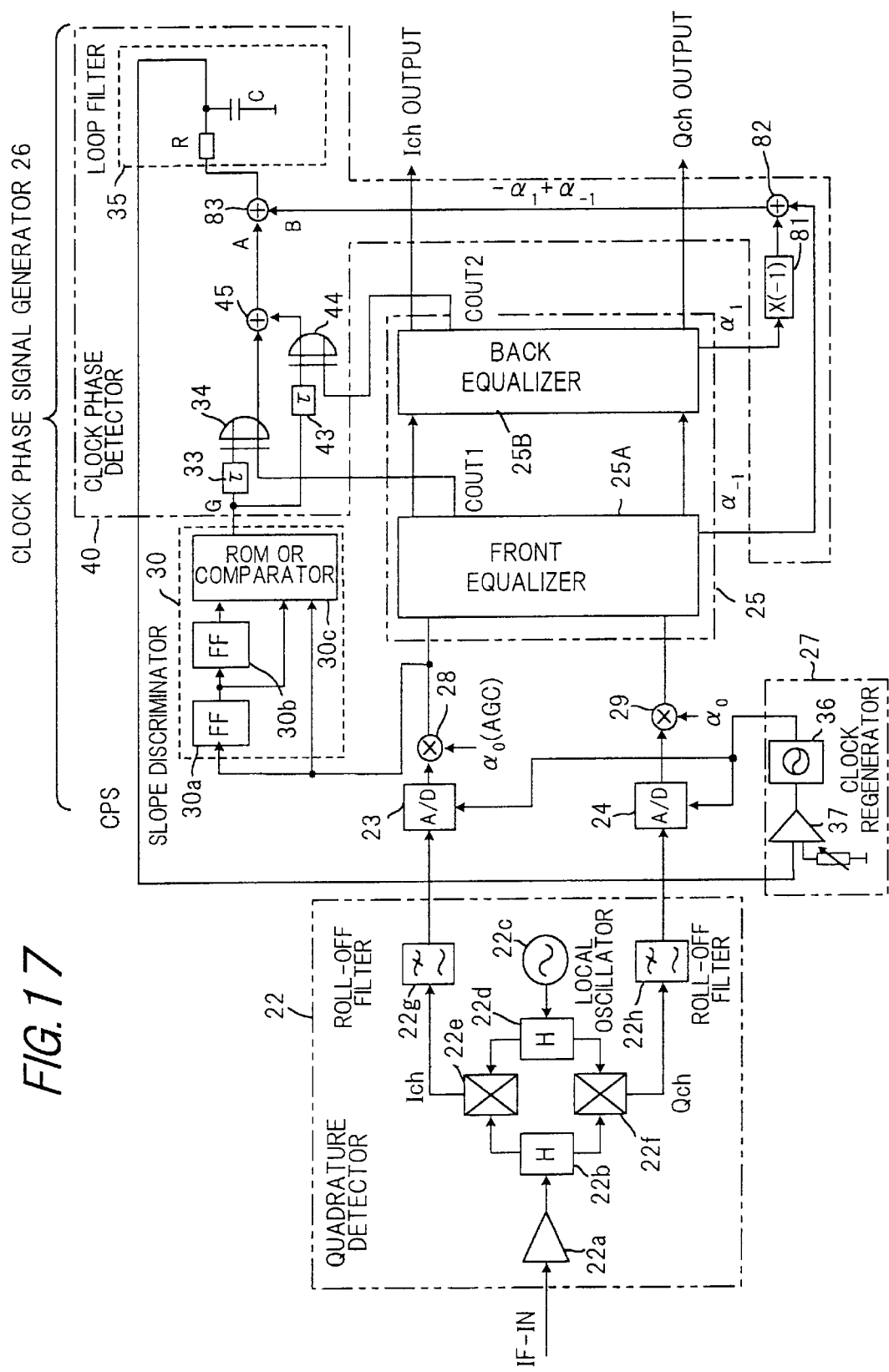
FIG. 17 is a diagram showing the construction of a radio receiving apparatus according to a sixth embodiment of the present invention.

FIG. 17 is a diagram showing the construction of the radio receiving apparatus according to a sixth embodiment of the present invention. Components identical with those shown in the second embodiment of FIG. 5 are designated by like reference characters. This embodiment differs from the second embodiment in that (1) $-\alpha_1+\alpha_{-1}$ is calculated, and (2) phase control is performed upon adding $-\alpha_1+\alpha_{-1}$ to the input of the loop filter of the second embodiment.

The clock phase detector 40 in FIG. 17 includes a sign reversing unit 81 for reversing the sign of the first tap coefficient $\alpha_1$ of the back equalizer 25B, an adder 82 for calculating $-\alpha_1+\alpha_{-1}$ and an adder 83 for adding $-\alpha_1+\alpha_{-1}$ to the results of the exclusive-OR operations performed by the EOR circuits 33, 44 and inputting the sum to the loop filter 35. The latter smoothes the value of the sum that has entered from the adder 83 and generates the clock phase signal CPS, and the clock regenerating circuit 27 controls the phase of the regenerated clock, based upon the phase signal CPS, in such a manner that he phase shift $\Delta t$ becomes zero. In this case an arrangement can be adopted in which the output A of the adder 45 and the output B of the EOR circuit 72 are suitably weighted and then summed by the adder 83, which outputs the sum.

In accordance with the sixth embodiment, phase control is performed upon adding $-\alpha_1+\alpha_{-1}$ to the loop filter input of the second embodiment. This makes it possible to improve the accuracy of the regenerated clock.

(H) Seventh Embodiment

In general, the tap coefficients on the quadrature side cannot be utilized as values indicating the clock phase. However, they can be used when deep phasing occurs. The reason for this is as follows: Demodulation in QAM is carried out by performing quadrature detection at a local frequency $\omega$ synchronized to the input IF signal A(t). Accordingly, we have $Ich$ baseband signal $\rightarrow A(t) \cdot \cos(\omega t)$ $Qch$ baseband signal $\rightarrow A(t) \cdot \sin(\omega t)$ On the other hand, when phasing occurs, these are combined with signals representing the time difference $\tau$. This gives us:

$Ich$ baseband signal $\rightarrow A(t) \cdot \cos(\omega t) + A(t+\tau) \cdot \cos[(\omega(t+\tau))]$ $Qch$ baseband signal $\rightarrow A(t) \cdot \sin(\omega t) + A(t+\tau) \cdot \sin[(\omega(t+\tau))]$ Here $A(t+\tau)$ signifies an offset between the impulse responses of the interference and main waves shown in FIG. 10A, 10B. The $\cos[\omega(t+\tau)]$ and $\sin[\omega(t+\tau)]$ portions signify rotation with respect to the quadrature phase plane of I, Q. When deep phasing occurs, these phase rotation components can no longer be ignored and the tap coefficients $\beta$ on the quadrature side change. In particular, when the phasing position shifts from the center, the phase rotation components become large in size.

As a result, phase control is performed by (1) adding $+(\beta_1+\beta_{-1})$ to the loop filter input if $\beta_1>\beta_{-1}$ holds, and (2) adding $-(\beta_1+\beta_{-1})$ is added to the loop filter input if $\beta_1<\beta_{-1}$ holds.

(b) Construction

Figure 18:
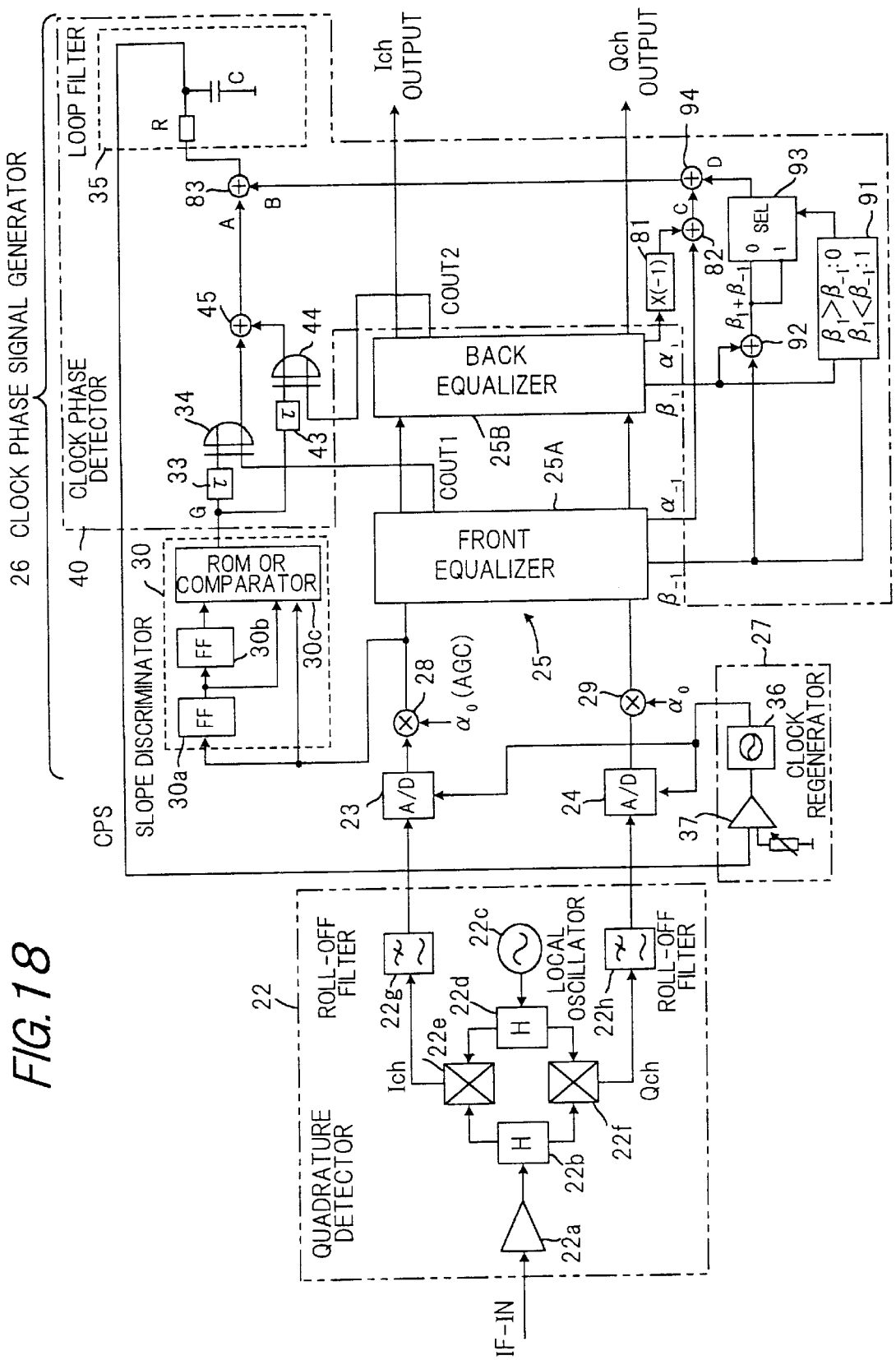
FIG. 18 is a diagram showing the construction of a radio receiving apparatus according to a seventh embodiment of the present invention.

FIG. 18 is a diagram showing the construction of the radio receiving apparatus according to a seventh embodiment of the present invention. Components identical with those shown in the sixth embodiment of FIG. 17 are designated by like reference characters. The seventh embodiment differs from the sixth embodiment in that phase control is performed upon adding $\pm(\beta_1+\beta_{-1})$ to the loop filter input of the sixth embodiment.

The clock phase detector 40 in the apparatus of FIG. 18 includes a comparator 91 for comparing the magnitudes of the tap coefficients $\beta_1$, $\beta_{-1}$, a selector 93 for outputting $(\beta_1+\beta_{-1})$ if $\beta_1>\beta_{-1}$ holds and $-(\beta_1+\beta_{-1})$ if $\beta_1<\beta_{-1}$ holds, and an adder 94 for adding the output $\pm(\beta_1+\beta_{-1})$ of the selector 93 and $(-\alpha_1+\alpha_{-1})$ of the selector and outputting the sum.

The sign reversing unit 81 of the clock phase detector 40 reverses the sign of the first tap coefficient $\alpha_1$ of the back equalizer 25B and the adder 82 calculates $-\alpha_1+\alpha_{-1}$. The comparator 91 compares the magnitudes of the tap coefficients $\beta_1$, $\beta_{-1}$ and the adder 92 performs the calculation $(\beta_1+\beta_2)$. The selector 93 outputs $(\beta_1+\beta_{-1})$ if $\beta_1>\beta_{-1}$ holds and $-(\beta_1+\beta_{-1})$ if $\beta_1<\beta_{-1}$ holds, and the adder 94 adds $\pm(\beta_1+\beta_{-1})$ and $(-\alpha_1+\alpha_{-1})$. The adder 83 adds $\pm(\beta_1+\beta_{-1})+(-\alpha_1+\alpha_{-1})$ to the results of the exclusive-OR operations performed by the EOR circuits 33, 44 and inputs the sum to the loop filter 35. The latter smoothes the value of the sum that has entered from the adder 83 and generates the clock phase signal CPS, and the clock regenerating circuit 27 controls the phase of the regenerated clock, based upon the phase signal CPS, in such a manner that he phase shift $\Delta t$ becomes zero.

In this case an arrangement can be adopted in which the output A of the adder 45 and the output B of the adder 94 are suitably weighted and then summed by the adder 83. Further, the output C of the adder 82 and the output D of the selector 93 are suitably weighted and then summed by the adder 94. The latter outputs the sum.

In accordance with the seventh embodiment, phase control is performed upon adding $(\beta_1+\beta_{-1})$ to the loop filter input of the sixth embodiment. This makes it possible to improve the accuracy of the regenerated clock even in a case where phasing is deep.

Though the foregoing describes a case in which the transversal equalizer is constituted by FIR filters, other digital filters may be used.

In accordance with the present invention, the output signal of a digital filter, e.g., a FIR filter, which constitutes a transversal equalizer, when the center tap coefficient $\alpha_0$ of the FIR filter is regarded as being zero is delivered as an error signal between input and output signals of the transversal equalizer, and a clock phase signal is outputted using the slope of the input signal of the equalizer and the error signal. As a result, the regenerated clock output by a clock regenerating circuit can be made to coincide with the optimum phase at which the eye pattern opens to the maximum extent, thereby making it possible to improve the accuracy of AD conversion processing executed by AD converters. Moreover, delay and subtractor circuits can be eliminated to simplify the construction of the radio receiving apparatus.

In accordance with the present invention, the transversal equalizer is separated into front and back equalizers and a clock phase signal is generated based upon the errors of the front and back equalizers. As a result, the accuracy of the regenerated clock can be improved. Further, the output signal of a FIR filter, which constitutes the front equalizer, when the tap coefficient $\alpha_0$ of the FIR filter is regarded as being zero is delivered as an error signal (first error signal) between input and output signals of the front equalizer, and the output signal of a FIR filter, which constitutes the back equalizer, when the tap coefficient $\alpha_0$ of the FIR filter is regarded as being zero is delivered as an error signal (second error signal) between input and output signals of the back equalizer. As a result, delay and subtractor circuits can be eliminated to simplify the construction of the radio receiving apparatus.

In accordance with the present invention, discrimination of slope is performed independently at the front and back equalizers. Though the number of slope discriminators is increased by one, it possible to obtain correct signal slopes conforming to the front and back equalizers and the accuracy of the regenerated clock can be improved.

In accordance with the present invention, phase (MP, NMP) is discriminated in the phasing state and phase control is performed, based upon the phase discriminated, using the error signal of whichever of the front and back equalizers has the smaller tap coefficient values. This makes it possible to suppress a decline in the accuracy of the regenerated clock. Moreover, the apparatus is capable of withstanding deep phasing.

In accordance with the present invention, final error E of the I-channel signal and slope G2 of the I-channel signal input to the back equalizer are multiplied together and the result is input to a loop filter unit to generate a phase signal. As a result, the phase accuracy of the regenerated clock can be improved and the ability to withstand deep phasing can be improved as well.

In accordance with the present invention, phase control is performed upon adding $(-\alpha_1+\alpha_{-1})$ to the input of the loop filter. This makes it possible to improve the phase accuracy of the regenerated clock.

In accordance with the present invention, phase control is performed by adding $\pm(\beta_1+\beta_{-1})$ as well as $(-\alpha_1+\alpha_{-1})$ to the loop filter input. This makes it possible to improve the phase accuracy of the regenerated clock even in a case where phasing is deep.

As many apparently widely different embodiments of the present invention can be made without departing from the spirit and scope thereof, it is to be understood that the invention is not limited to the specific embodiments thereof except as defined in the appended claims.

What is claimed is:

1. A radio receiving apparatus for regenerating a clock synchronized to a symbol clock contained in a quadrature demodulated signal obtained by demodulating a multilevel quadrature modulated signal, AD converting the quadrature demodulated signal, at the timing at which the regenerated clock occurs, to digital data and outputting the digital data, which has been obtained by the AD conversion, via a transversal equalizer, comprising:

a clock regenerating circuit for regenerating a clock synchronized to the symbol clock;

a slope discriminator for obtaining the slope of one signal of an in-phase signal (I-channel signal) and quadrature signal (Q-channel signal) input to the transversal equalizer;

means for outputting, as an error signal that takes into account a signal delay time between input and output signals of the transversal equalizer, an output signal of a filter which prevails when a center tap coefficient $\alpha_0$ of the filter is regarded as being zero, said filter constituting the transversal equalizer to which said one signal is input; and a clock phase detector for outputting a phase signal, which conforms to a phase difference between the regenerated clock and the symbol clock, using the slope and the error signal; wherein said clock regenerating circuit controls the phase of the regenerated clock based upon the phase signal, and an AD converter converts the quadrature demodulated signal, at the timing at which the regenerated clock occurs, to digital data and outputs the digital data via the transversal equalizer.

2. The apparatus according to claim 1, wherein said clock phase detector has a circuit for outputting the phase signal, which conforms to the phase difference between the regenerated clock and the symbol clock, based upon a combination of the sign of the slope and the sign of the error signal.

3. A radio receiving apparatus for regenerating a clock synchronized to a symbol clock contained in a quadrature demodulated signal obtained by demodulating a multilevel quadrature modulated signal, AD converting an In-phase signal (I-channel signal) and quadrature signal (Q-channel signal), which constitute the quadrature demodulated signal, at the timing at which the regenerated clock occurs, to digital data, and outputting the digital data, which has been obtained by the AD conversion, via a transversal equalizer having a front equalizer and a back equalizer which are constructed by separating each filter constituting the transversal equalizer into two halves about a center tap, comprising:

a slope discriminator for obtaining the slope of a signal of a predetermined channel, which is an I-channel signal or Q-channel signal input to the front equalizer;

means for adopting, as a first error signal between input and output signals of the front equalizer, a signal of the predetermined channel output from the front equalizer, prevailing when a tap coefficient $\alpha_0$ of the center tap is regarded as being zero;

means for adopting, as a second error signal between input and output signals of the back equalizer, a signal of the predetermined channel output from the back equalizer prevailing when an output signal of the front equalizer that enters the back equalizer is regarded as being zero;

a clock phase detector for outputting a phase signal, which conforms to a phase difference between the regenerated clock and the symbol clock, based upon combination of the sign of the slope and the sign of each error signal; and a clock regenerating circuit for regenerating a clock synchronized to the symbol clock based upon the phase signal; wherein the I-channel signal and Q-channel signal are converted, at the timing at which the regenerated clock occurs, to digital data and the digital data is output via the equalizer circuit.

4. The apparatus according to claim 3, wherein said equalizer circuit is a decision feedback equalizer having said front equalizer and said back equalizer.

5. The apparatus according to claim 3, wherein said clock phase detector includes:

a first circuit for outputting a first signal, which conforms to the phase difference, based upon a combination of the sign of the slope and the sign of the first error signal;

a second circuit for outputting a second signal, which conforms to the phase difference, based upon a combination of the sign of the slope and the sign of the second error signal; and a combining circuit for combining the first and second signals to output the phase signal.

6. The apparatus according to claim 5, wherein said clock phase detector further includes:

a phasing state discriminator for discriminates whether a phasing state is a minimum phasing state in which an interference wave lags behind a main wave or a non-minimum phasing state in which a main wave lags behind an interference wave; and means for selectively inputting the first and second signals to the combining circuit or changing weighting of the first and second signals and then inputting the first and second weighted signals to the combining circuit based upon results of phasing discrimination by said phasing state discriminator.

7. The apparatus according to claim 6 wherein said phasing state discriminator discriminates the phasing state by comparing a total signal A of absolute values of one or more tap coefficients in the front equalizer and a total signal B of absolute values of one or more tap coefficients in the back equalizer.

8. The apparatus according to claim 6 wherein said phasing state discriminator discriminates the phasing state by determining whether signs of first and second tap coefficients in the front equalizer are identical and whether signs of first and second tap coefficients in the back equalizer are identical.

9. The apparatus according to claim 3, wherein said clock phase detector includes:

a slope discriminator for obtaining the slope of the input signal to the back equalizer;

a first circuit for outputting a first signal, which conforms to the phase difference, based upon a combination of the sign of the slope of the input signal to the front equalizer and the sign of the first error signal;

a second circuit for outputting a second signal, which conforms to the phase difference, based upon a combination of the sign of the slope of the input signal to the back equalizer and the sign of the second error signal; and a combining circuit for combining the first and second signals to output the phase signal.

10. The apparatus according to claim 3, wherein said clock phase detector controls the phase signal based upon the slope of the input signal to the back equalizer and an error contained in the output signal of the back equalizer.

11. The apparatus according to claim 10, wherein said clock phase detector includes:

a first circuit for outputting a first signal, which conforms to the phase difference, based upon a combination of the sign of the slope of the input signal to the front equalizer and the sign of the first error signal;

a second circuit for outputting a second signal, which conforms to the phase difference, based upon a combination of the sign of the slope of the input signal to the front equalizer and the sign of the second error signal;

a slope discriminator for obtaining the slope of the input signal to the back equalizer;

a third circuit for outputting a third signal, which conforms to the phase difference, based upon the sign of the slope of the input signal to the back equalizer and the error contained in the output signal of the back equalizer; and a combining circuit for combining the first, second and third signals to output the phase signal.

12. The apparatus according to claim 3, wherein said one signal is the in-phase signal, a first tap coefficient value of the filter in the front equalizer and a value obtained by reversing the sign of a first tap coefficient value of the filter in the back equalizer are added to give a sum, and said clock phase detector controls the value of the phase signal based upon said sum.

13. The apparatus according to claim 12, wherein a first tap coefficient $\beta_{-1}$ on a quadrature side of the front equalizer and a first tap coefficient $\beta_1$ on a quadrature side of the back equalizer are added to give a sum, magnitudes of the tap coefficients $\beta_{-1}$, $\beta_1$ are compared, and said clock phase detector controls the value of the phase signal on the basis of a value obtained by reversing the sign of said sum in a case where $\beta_1 < \beta_{-1}$ holds, and on the basis of said sum in a case where $\beta_1 > \beta_{-1}$ holds.

* * * * *